United States Patent
Kucharski et al.

(10) Patent No.: US 10,558,191 B2
(45) Date of Patent: *Feb. 11, 2020

(54) GENERATION AND PUBLICATION OF SHARED TAGSETS

(71) Applicant: Rockwell Automation Technologies, Inc., Mayfield Heights, OH (US)

(72) Inventors: Paul G. Kucharski, Mukwonago, WI (US); Charles M. Rischar, Chardon, OH (US); Michael Kalan, Highland Heights, OH (US); David Van Gompel, Solon, OH (US); Brian A. Batke, Novelty, OH (US); Joseph P. Izzo, New Berlin, WI (US); David A. Johnston, Mentor, OH (US)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 9 days.

This patent is subject to a terminal disclaimer.

(21) Appl. No.: 15/968,152

(22) Filed: May 1, 2018

(65) Prior Publication Data

US 2018/0246488 A1 Aug. 30, 2018

Related U.S. Application Data

(63) Continuation of application No. 14/733,323, filed on Jun. 8, 2015, now Pat. No. 9,989,951, which is a
(Continued)

(51) Int. Cl.
*G05B 19/05* (2006.01)
*G05B 19/042* (2006.01)
*H03M 13/09* (2006.01)

(52) U.S. Cl.
CPC ....... *G05B 19/054* (2013.01); *G05B 19/0426* (2013.01); *H03M 13/09* (2013.01); *G05B 2219/23192* (2013.01)

(58) Field of Classification Search
None
See application file for complete search history.

(56) References Cited

U.S. PATENT DOCUMENTS

| 6,457,103 B1 | 9/2002 | Challenger et al. |
| 6,834,388 B1 | 12/2004 | Elsbree |

(Continued)

FOREIGN PATENT DOCUMENTS

| CN | 101127007 A | 2/2008 |
| CN | 101154107 A | 4/2008 |
| WO | 2007076284 | 7/2007 |

OTHER PUBLICATIONS

Chinese Office Action (with English translation) dated Feb. 2, 2015 for Chinese Patent Application No. 201210482819.7, 13 pages.
(Continued)

*Primary Examiner* — Ryan A Jarrett
(74) *Attorney, Agent, or Firm* — Amin, Turocy & Watson, LLP

(57) ABSTRACT

Systems and methods are provided to facilitate receipt of tag requests from one or more interfaces, based upon which a single tagset is compiled at a controller comprising all the requested tags for a given update rate, whereupon the single compiled tagset is subsequently forwarded to the one or more interfaces. A controller generates a superset of tags associated with an industrial process. Each interface can request a copy of the superset, from which the required tags are selected. The controller receives the requested tags from all of the interfaces and combines the requested tags into a single tagset, for a given update rate, comprising the various parameters associated with the tags. At the selected update
(Continued)

rate, the tagset is forwarded to the interfaces. A masterset can be utilized to identify the sequence of tags in a tagset and check code can ensure continuity of the tags in the tagset.

20 Claims, 16 Drawing Sheets

Related U.S. Application Data continuation of application No. 13/296,072, filed on Nov. 14, 2011, now Pat. No. 9,069,343.

(56) References Cited

U.S. PATENT DOCUMENTS

| | | | |
|---|---|---|---|
| 7,392,100 | B1 | 6/2008 | Thomas et al. |
| 7,725,528 | B1 | 5/2010 | Zink et al. |
| 8,490,075 | B2 | 7/2013 | Waris et al. |
| 8,527,657 | B2 | 9/2013 | Klee et al. |
| 9,069,343 | B2 * | 6/2015 | Kucharski .......... G05B 19/0426 |
| 9,989,951 | B2 * | 6/2018 | Kucharski .......... G05B 19/0426 |
| 2006/0075236 | A1 | 4/2006 | Marek et al. |
| 2007/0076267 | A1 | 4/2007 | Pierce et al. |
| 2009/0089233 | A1 | 4/2009 | Gach et al. |
| 2009/0234850 | A1 | 9/2009 | Kocsis et al. |
| 2009/0327354 | A1 | 12/2009 | Resnick et al. |
| 2011/0015764 | A1 | 1/2011 | Chen et al. |
| 2011/0126142 | A1 | 5/2011 | Zhou et al. |
| 2013/0124575 | A1 | 5/2013 | Plache et al. |

OTHER PUBLICATIONS

Office Action dated May 22, 2014 for U.S. Appl. No. 13/296,072, 70 pages.
Office Action dated Nov. 6, 2014 for U.S. Appl. No. 13/296,072, 16 pages.
Chinese Office Action (with English translation), dated Oct. 28, 2015 for Chinese Patent Application No. 201210482819.7; 7 pages.
Non-Final Office Action dated Aug. 17, 2017 for U.S. Appl. No. 14/733,323, 22 pages.
Extended European Search Report received for European Application No. 12192672.9, dated Nov. 27, 2017, 8 pages.
Allen-Bradly: "EtherNet/IP Modules in Logix5000 Control Systems",Jan. 1, 2010, pp. 1-230, XP055106158, Retrieved from the Internet: URL: http://www.jlab.org/Hall-D/Documents/manuals/Allen-Bradleystuff/EtherNet-IPModulesinLogix5000ControlSystemsusermanual.pdf.
Wolfgang Mahnke: "OPC Unified Architecture" In: "OPC Unified Architecture", Mar. 19, 2009, XP055160132, ISBN: 978-3-54-068898-3 pp. 1-339.
Chinese Office Action (with English translation), dated Feb. 9, 2018 for Chinese Patent Application No. 201610345018.4, 11 pages.
U.S. Appl. No. 14/733,323, filed Jun. 8, 2015.
U.S. Appl. No. 13/296,072, filed Nov. 14, 2011.

* cited by examiner

GENERATION AND PUBLICATION OF SHARED TAGSETS

RELATED APPLICATIONS

This application is a continuation of, and claims priority to each of, U.S. patent application Ser. No. 14/733,323, filed on Jun. 8, 2015, entitled "GENERATION AND PUBLICATION OF SHARED TAGSETS", and now issued as U.S. Pat. No. 9,989,951, which is a continuation of, U.S. patent application Ser. No. 13/296,072, filed Nov. 14, 2011, and entitled "GENERATION AND PUBLICATION OF SHARED TAGSETS", and now issued as U.S. Pat. No. 9,069,343. The entireties of the aforementioned applications are hereby incorporated herein by reference.

TECHNICAL FIELD

The subject specification relates generally to control systems employed in an industrial automation environment and in particular to generation and publication of tagset(s) to at least one interface associated with a controller.

BACKGROUND

Computer systems, as with other operating environments, have found numerous applications in the industrial automation environment and are employed ubiquitously throughout, e.g., to control the operation of a device, machine, process, and the like. To facilitate control of a process, etc., one or more controllers are utilized with I/O devices controlling operation of the process along with gathering process information (e.g., measurements, data, values, parameters, variables, metadata, etc.) pertaining to how the process is performing. To maximize interaction of an operator with the process, the process information can be forwarded from the controller to one or more interfaces, also known as human machine interfaces (HMI's), graphical user interfaces (GUI), terminals, and the like, for display to the operator. Upon review of the displayed process information, and in conjunction with hard and soft controls associated with the interface, the operator can further adjust the process as required to facilitate correct process operation. Commands can be generated at the interface, forwarded to the controller, and accordingly acted upon by the controller. For example, the temperature of a furnace can be detected by a thermocouple, signals are sourced from the thermocouple by the controller, forwarded by the controller for display on the interface, whereupon an operator notices a drop in the furnace temperature, presses an 'increase temperature' control, and a furnace heater is switched on in response, via the controller.

However, in a conventional system, the various parameters, measurements, data, values, variables, metadata, etc., comprising the process information, have to be generated for each respective interface monitoring the process regardless of whether any of the interfaces are receiving process information which is also being displayed on another interface. Such operation of generating unique packets of data in response to each process information data "pull" request generated by each interface monitoring a process is inefficient and places unnecessary operational burden on a controller associated with the process.

The above-described deficiencies of conventional interface-controller systems are merely intended to provide an overview of some of the problems of conventional systems and techniques, and are not intended to be exhaustive. Other problems with conventional systems and techniques, and corresponding benefits of the various non-limiting embodiments described herein may become further apparent upon review of the following description.

SUMMARY

A simplified summary is provided herein to help enable a basic or general understanding of various aspects of exemplary, non-limiting embodiments that follow in the more detailed description and the accompanying drawings. This summary is not intended, however, as an extensive or exhaustive overview. Instead, the sole purpose of this summary is to present some concepts related to some exemplary non-limiting embodiments in a simplified form as a prelude to the more detailed description of the various embodiments that follow.

Systems and methods are provided which include receipt of tag requests from one or more interfaces, based upon which a single tagset is compiled at a controller comprising all the requested tags for a given update rate (e.g., screen refresh rate, data capture rate, etc.). Based thereon a single instance of the compiled tagset is subsequently forwarded to the one or more interfaces. In various, non-limiting embodiments, a controller generates a superset of tags being monitored/received by the controller from an associated process. Each interface associated with the controller can request a copy of the superset, from which the interface identifies which tags are of interest, for example, based upon information to be displayed in any of a plurality of screens on the interface. In an embodiment, tags can be selected based on one or more update rates, hence a parameter value can be selected to be sent at a first update rate (e.g., a high update rate such as 100 ms) while a second parameter can be selected to be sent at a second update rate (e.g., a slower update rate such as 5 seconds). The controller receives the requested tags from all of the interfaces and combines the requested tags into a single tagset comprising the various parameters associated with the tags, for each requested update rate. In accordance with a given update rate, an instance of the tagset is forwarded to the interfaces. For example, if an interface(s) has tags selected for the fastest update rate, a tagset is generated and forwarded (e.g., broadcast) to each of the interfaces every 100 ms, regardless of whether any of the other interfaces requested data at such an update rate. Any tags or tagsets received by an interface, but not of interest to the interface, can be ignored by the interface.

In an embodiment, the tagset can comprise of tags being uniquely requested by an interface, tags being requested by two or more interfaces for the same update rate, or tags being requested by two or more interfaces but with different update rates, and other combinations thereof. The tags in the tagset which have been requested by a particular interface can be extracted by the interface, while those tags in the tagset which were not requested by the interface can be ignored by the interface.

In another embodiment, upon receipt of the respective tag requests, the controller can determine whether any of the tags received in the first request have the same update time as the tags in the second request. Based upon the determination of tags having common update rates, the common tags are pooled based upon update rate. For the tags which do not have a common update rate, a unique occurrence for each of the tags is generated for each respective update rate, as required to satisfy the respective tag requests received from the interfaces.

In a further embodiment, a check code associated with the tagset can be monitored, in conjunction with a tags masterset. As each tagset is compiled by the controller, a check code (e.g., CRC or similar) can be generated having a value based upon the tags in the tagset, whereupon the check code is calculated for each instance of the tagset and forwarded with the tagset. In an embodiment, the check code value can be based upon the ASCII characters comprising the names/identifiers of the individual tags in the tagset. In another embodiment, the check code can be a non-calculated value such as a time stamp (e.g., to µSec resolution) indicating when a change was made to a masterset. An interface can be configured to monitor a received tagset to identify whether a check code value has changed. In an embodiment, in response to determining that the check code value has not changed, it can be assumed that the tags received in the tagset are the same as those previously received and the sequence of parameter values is consistent. In a further embodiment, in response to a determination that the check code value has changed, the masterset for the newly received tagset can be reviewed to identify the sequence of tags (and effectively the sequence of parameter values) in the tagset.

In one embodiment, a masterset can accompany the tagset thereby enabling the interface to simply review the accompanying masterset to obtain the new sequence of tags (and therefore parameter values) in the tagset. In another embodiment the masterset does not accompany the tagset, and a request can be placed by the interface for the controller to forward the masterset associated with the newly received tagset, thereby enabling the interface to subsequently determine the new sequence of tags.

In a further embodiment, the tags, tagset, check code, masterset, superset, etc. can be stored in non-volatile memory at the controller. In the event of an interface losing communication with the controller (e.g., controller and/or interface taken offline, power failure, maintenance, etc.) the interface can query the controller to identify the tags which were being monitored by the interface prior to communication loss. Hence, rather than a loss of communication resulting in loss of information regarding which tags are being requested, utilizing non-volatile memory enables the requested set of tags to be re-established.

These, and other embodiments, are described in more detail below.

BRIEF DESCRIPTION OF THE DRAWINGS

Various non-limiting embodiments are further described with reference to the accompanying drawings in which.

DETAILED DESCRIPTION

Overview of Common Tagset Generation and Sharing

As previously described, a plurality of process information is available to be published on interfaces associated with a process, however, conventionally, a unique packet of data has to be generated in a system where interfaces operate in a "pull" manner, where requests are made to a controller to provide each packet of data, regardless of whether instances of data comprising the data packets are common to two or more of the interfaces.

For the sake of readability an interface, terminal, HMI, GUI, and the like, are referred to as an interface, however, it is to be appreciated that the term interface relates to any device, machine, component, software, etc., facilitating communication between an entity controlling an operation and a device, machine, component, software, etc., effecting or performing the operation.

Figure 1:
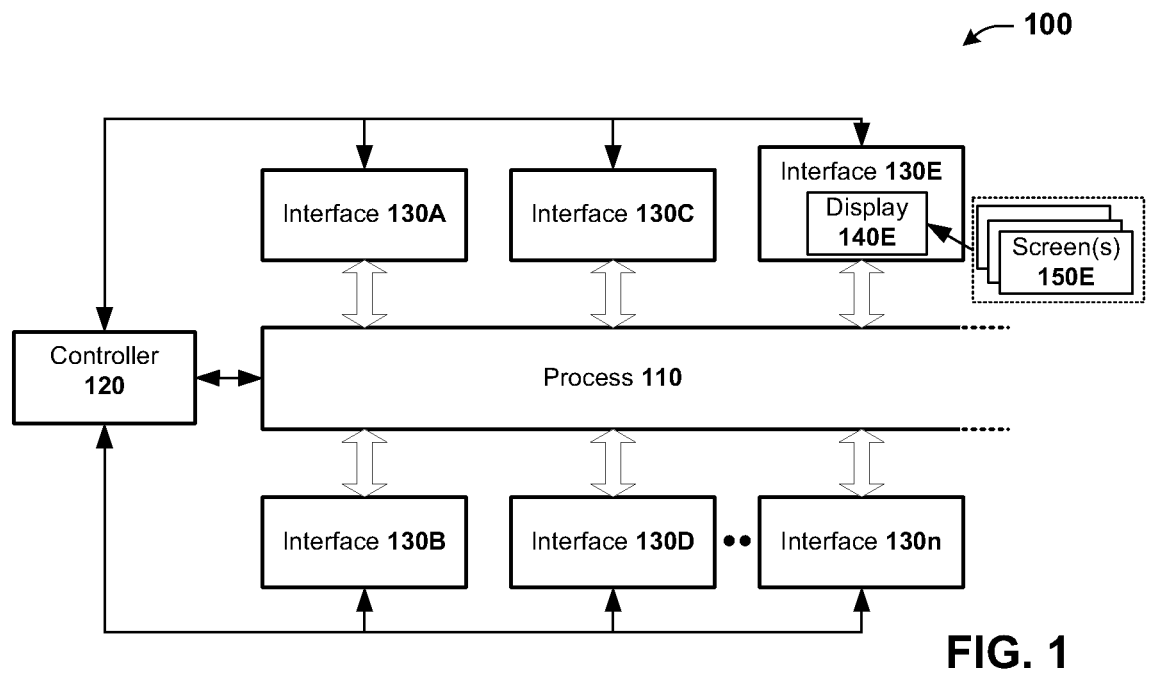
FIG. 1 is a block diagram illustrating process information regarding a process being presented at a plurality of interfaces via a controller.

FIG. 1, illustrates process information regarding a process 110 being presented at a plurality of interfaces (interfaces 130A-130n, where n is a positive integer greater than 1, as used throughout the description) via controller 120. Information regarding process 110 is displayed on a respective interface and, based thereon, an operator can make any necessary adjustments to operation of respective components and devices comprising, or associated with, process 110. In an aspect, a wealth of information can be generated with regard to process 110, where such information can include process measurements (e.g., speed(s), rate(s), temperature(s), pressure(s), etc.) obtained from devices controlling/monitoring process 110, as well being generated by ancillary processes such as processes monitoring scrap levels, energy usage, commodity usage, maintenance, and the like. It is not uncommon that the information comprises hundreds, thousands, if not more, parameters, etc., associated with, and describing operation of the process 110.

Further, to facilitate presentation of the wealth of information, a large number of screens (e.g., such as screen(s) 150E) are programmed and available for information presentation (e.g., such as on display 140E) on any of the interfaces 130A-130n. A number of the screens may be common to each of the interfaces 130A-130n, i.e., available for presentation on any interface, while other screens may be unique to a particular interface, or subset of interfaces, comprising the available interfaces 130A-130n. Accordingly, a number of parameters may be common to all the interfaces 130A-130n, while a subset of the parameters may only be required for display on a subset of interfaces comprising the available interfaces 130A-130n. For example, of a thousand parameters being monitored by controller 120, seven hundred are displayed commonly across all the interfaces 130A-130n, while of the remaining three hundred parameters, ten are uniquely displayed on interface 130A, seventy are uniquely displayed on interface 130B, twenty five are displayed on both interfaces 130A and 130B, fifty seven are uniquely displayed on interface 130C, etc.

Furthermore, for example, of one hundred screens programmed for display on interfaces 130A-130n, sixty eight screens are commonly displayed on all interfaces 130A-130n, while five screens are uniquely displayed on interface 130A, seven screens are uniquely displayed on interface 130B, nine screens are displayed only on interfaces 130A, 130B and 130D, etc.

Hence, it is feasible that of a wealth of parameters, etc., being monitored, a number of the parameters may be of common interest for display on any of the interfaces (e.g., interfaces 130A-130n) associated with process 110, while various subsets may be of interest for display on a particular interface, or subset of interfaces comprising the available interfaces 130A-130n.

Figure 2:
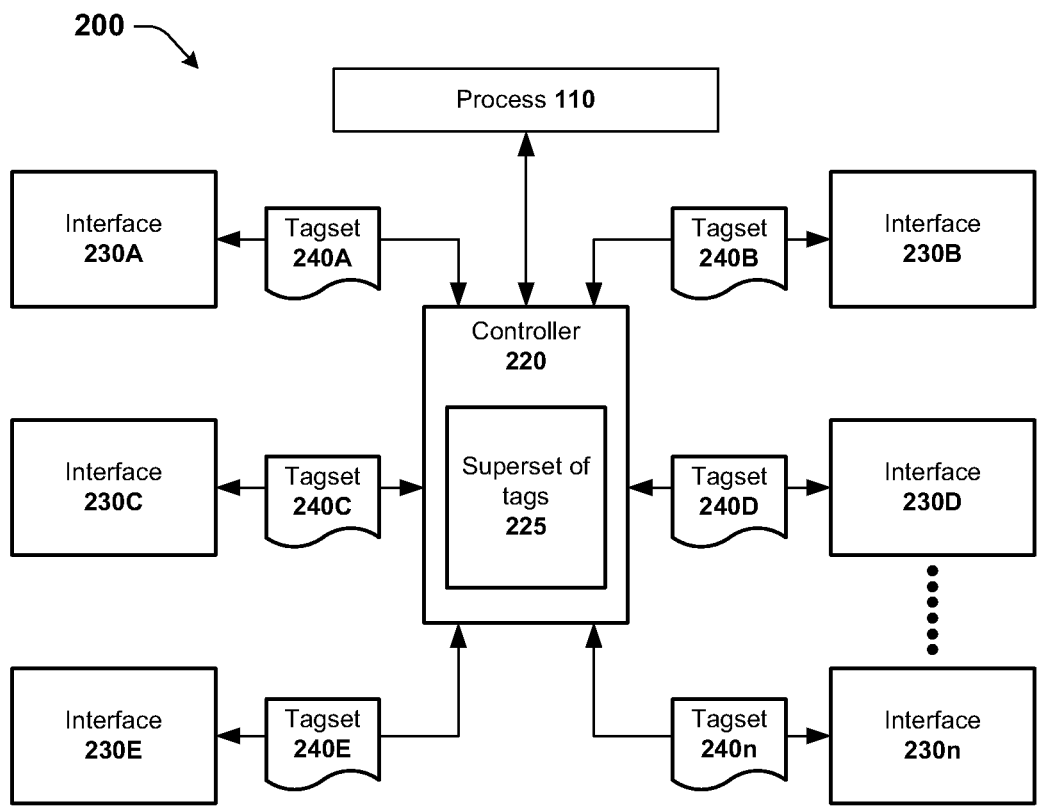
FIG. 2 is a block diagram illustrating a conventional system wherein a unique data packet is generated for each interface associated with a monitored process.

As shown in FIG. 2, the various parameters, measurements, variables, settings, values, metadata, etc., comprising the process information can be compiled and presented on any respective interface. For the sake of readability, the process information measurements, parameters, variables, settings, values, metadata, etc., are hereinafter referred to a 'tags'. FIG. 2 illustrates a conventional system wherein from all the available tags (e.g., compiled in superset 225) a unique tagset (e.g., any of tagsets 240A-240n) is compiled for each respective interface (e.g., for any of interfaces 230A-230n). For example, interface 230A has an associated tagset 240A while interface 230D has an associated tagset 240D. Hence, at each respective publication of a tagset (e.g., to satisfy a process update time, interface refresh time, interface display update, etc.) a new tagset (e.g., any of tagsets 240A-240n) has to be generated for each respective interface regardless of whether any of the interfaces are receiving information regarding a tag(s) which is also being received on one or more of the other interfaces. Such operation of generating unique tagsets is inefficient and places unnecessary operational burden on a controller (e.g., controller 220) associated with process 110 and monitoring interfaces (e.g., any of interfaces 230A-230n).

As described, in a typical process of all the available tags, a large number of tags may be commonly displayed across the plurality of interfaces, while a fraction of the available tags may be specific for display by a particular interface, or subset of interfaces, comprising the available interfaces and are not shared across the whole process. However, the conventional approach of generating specific tagsets for specific interfaces is inefficient as the controller has to compile and forward a separate tagset for each interface.

Figure 3:
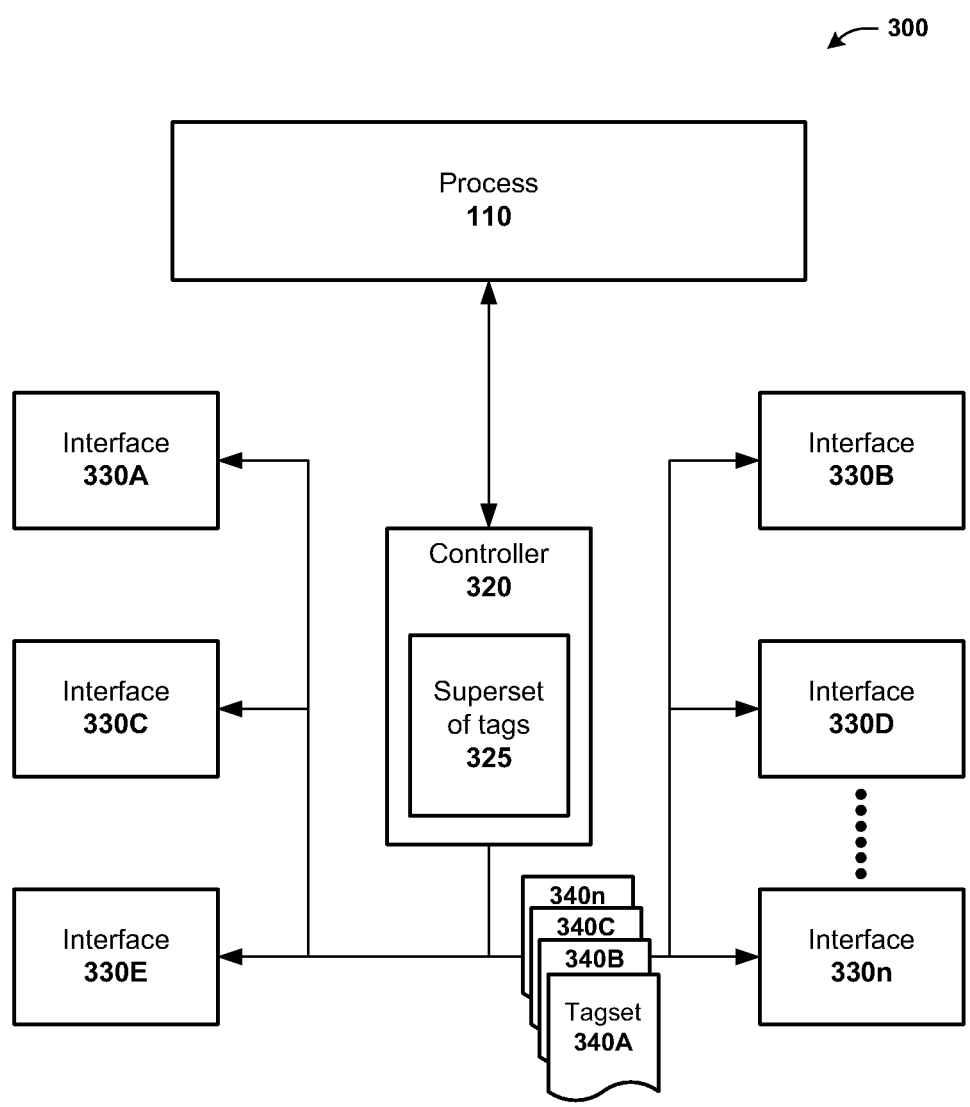
FIG. 3 is a block diagram illustrating an exemplary, non-limiting embodiment for compiling a tagset to be published and shared commonly across a plurality of interfaces.

FIG. 3, illustrates an exemplary, non-limiting embodiment for compiling a tagset to be published and shared across a plurality of interfaces. Depicted is controller 320 monitoring process 110, wherein the controller 320 includes a superset of tags 325. The superset of tags 325 (or any subset thereof) are available to be displayed on any of interfaces 330A-330n associated with controller 320. The superset 325 is dynamically created, for example, controller 320 updates superset 325 as new process parameters are detected, and alternatively as a process parameter no longer is available. Unlike the conventional approach depicted in FIG. 2, in this exemplary embodiment, rather than each interface receiving its own unique tagset, a compilation of requested tags, tagsets 340A-n, are generated by controller 320 and published commonly to each of the subscribing interfaces 330A-330n. Each of tagsets 340A-n is essentially a compilation of all tags requested by interfaces 330A-330n for a respective update rate (as described further below). For example, tagset 340A may comprise of tags requested for a first update rate such as 100 ms, tagset 340B may comprise of tags requested for a second update rate such as 500 ms, tagset 340C may comprise of tags requested for a third update rate such as 1 second, tagset 340n may comprise of tags requested for a third update rate such as 5 seconds, etc. Rather than each interface (e.g., any of interfaces 330A-330n) requesting from controller 320 specific tags for that interface and receiving a tagset unique to the interface, controller 320 compiles all the received tag requests for common update rates and based thereon, generates any of tagsets 340A-n which are shared commonly amongst all of the interfaces. Upon receipt of any of tagsets 340A-n, an interface identifies which tags are of interest to the interface (e.g., have been selected by the interface) and can ignore the remaining tags in the received tagset.

In comparison with a conventional system (e.g., FIG. 2) where unique tagsets are generated for each interface, only a single tagset is generated for each update rate (being compiled based on the plurality of tag requests having a common update rate) and the tagset for each update rate is broadcast/forwarded/shared amongst the plurality of interfaces requesting any of the available tags. Hence, in a conventional system comprising, for example, six interfaces, six unique instances of a tagset have to be generated, one for each of the interfaces. However, in accord with various embodiments presented herein, only one tagset per update rate has to be generated for forwarding to all six of the interfaces. Further, as described below, two or more interfaces may be requesting the same tag for a given update time, and hence only one occurrence of the tag in the respective update time group is required in the tagset. With a conventional system, each unique tagset will require, for each occurrence of a common tag, the tag to be generated in the tagset. In view of the embodiments presented herein, only one occurrence of the tag has to be generated for a given update time (as required), which can reduce the amount of compilation, data gathering, computation, etc., to be performed by the controller.

It is to be appreciated that while the terms "list", "set", "taglist", "tagset", "superset", "masterset", and the like, are used through the description, it is to be appreciated that the tagset(s), etc., are not limited to conveying information (e.g., parameter names, parameter values, etc.) in the format of a list, but other data structures as known to a person of skill in the art can be utilized for a tagset. Hence the term tagset can be replaced with the term taglist, set of tags, subset of tags, and the like.

Further, it is to be appreciated that the various embodiments presented herein are not confined to respective operation by a controller device or an interface, but can be utilized by any component associated with a process and/or involved with the generation of process information, e.g., a server.

Figure 4:
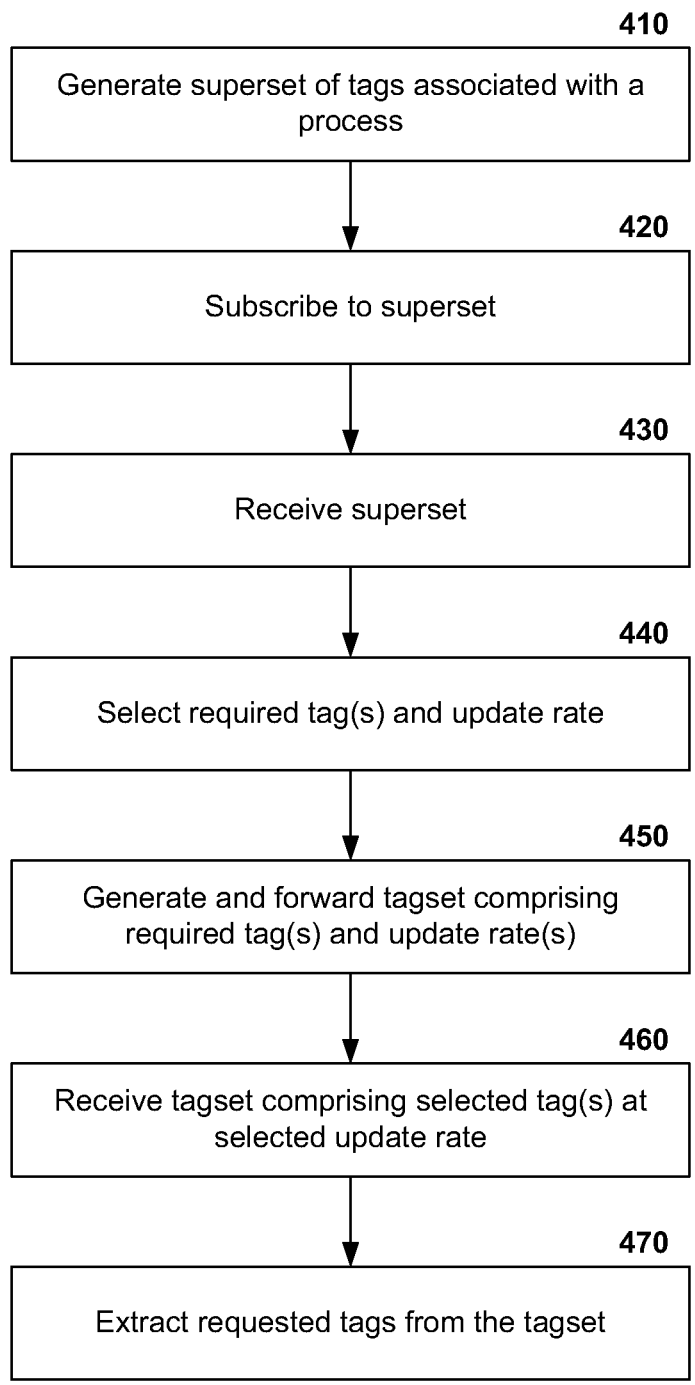
FIG. 4 is a flow diagram illustrating an exemplary, non-limiting embodiment for the compilation of tag requests and, based thereon, generating a tagset to be shared across all of the interfaces associated with a monitored process.

Turning to FIG. 4, is a high-level flow diagram illustrating an exemplary, non-limiting embodiment for the compilation of tag requests and, based thereon, generating a tagset to be shared across all of the interfaces associated with a process being monitored. At 410 a superset of tags (e.g., superset 325) associated with a monitored process (e.g., process 110) are generated at a controller (e.g., controller 320) associated with the process. As previously mentioned, the tags relate to the various parameters, variables, etc., being monitored and/or controlled by the controller in association with the process.

At 420 any interfaces (e.g., any of interfaces 330A-330n) associated with the process can request a copy of the superset from the controller.

At 430 the requesting interface(s) receive a copy of the superset from the controller.

At 440, at each respective interface, tags are selected, from the received superset, to be published to the respective interface at requested update rates. The update rate relates to how often (e.g., frequency of delivery) a particular interface requires a tag. For example, for a critical parameter that is changing rapidly (e.g., position of a cutting tool during a machining process) then the parameter is required to be displayed at the highest rate possible, and accordingly has a high update rate, such as 100 ms. However, another parameter may not change so quickly, or is of a lesser interest, such as furnace temperature as the interface operator only needs to view the temperature and an update rate of one second or longer is acceptable. The update rate can be a function of a plurality of factors such as capture rate (e.g., rate at which the I/O device providing the measured value is able to generate a new value), processing rate at the controller, screen refresh rate at the interface, how critical the parameter is, rate at which the parameter changes, and the like. Conventional systems typically do not offer the flexibility of generating tags (and associated parameter values) in accordance with different rates of update/delivery. With conventional systems, the time-duration with which a new tags set is generated is typically fixed across a system and can often be a function of the slowest device in the system.

At 450, a common tagset (e.g., any of tagsets 340A-n) is compiled at the controller comprising the requested tag(s) in accord with the update rate(s) received from the respective interface(s) associated with the controller. Upon compilation, the tagset per update rate is forwarded from the controller to each of the interfaces requesting tags at the respective update rate.

At 460, the common tagset per update rate is received at each respective interface which have requested subscription of the tags from the superset (at that update rate).

At 470, upon receipt of the tagset, the interface extracts the required tags (e.g., those requested at 440) to update the information presented on the interface display component.

Exemplary Operation of Controller Device in Tagset Generation and Sharing

Figure 5:
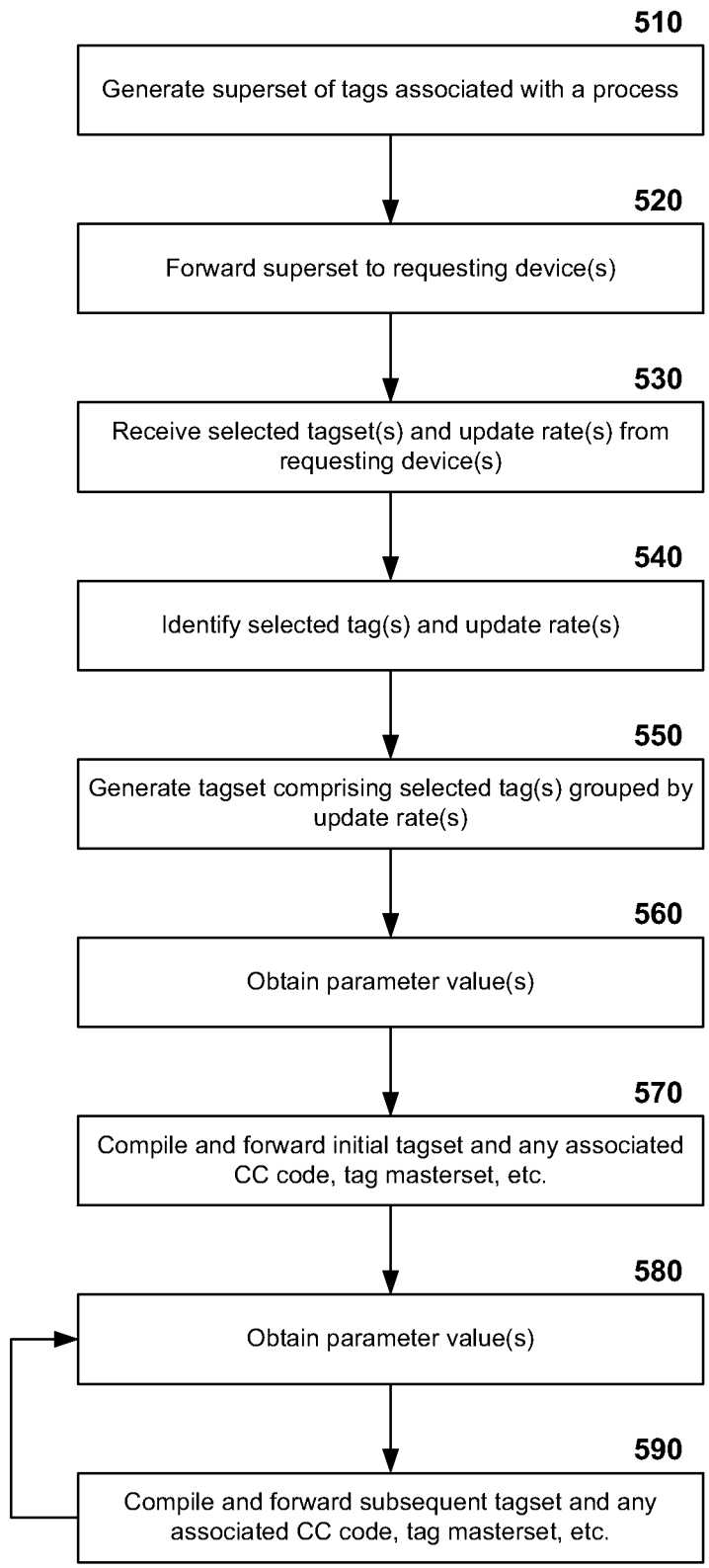
FIG. 5 is a flow diagram of an exemplary, non-limiting embodiment for generation and sharing of tagsets by a controller component.

FIG. 5 is a flow diagram of an exemplary, non-limiting embodiment for generation and sharing of tagsets by a controller component. The flow diagram relates to generation and sharing of tagsets by a controller component associated with (e.g., controlling, monitoring, etc.) a process. At 510 a superset of tags (e.g., superset 325) associated with a process (e.g., process 110) are generated by a controller (e.g., controller 320). The superset of tags relate to parameters, variables, etc., that are being monitored, or associated with, the process. At 520 the superset is forwarded to any devices, for example interfaces (e.g., interfaces 330A-330n) requesting the superset from the controller. At 530, at the controller, the received selected tags for respective update rates are received from the requesting devices. At 540, the various tags of interest are identified along with the selected update rates, as explained further below. At 550, from the identified tags and associated update rates, a tagset is compiled comprising the selected tags for a particular update rate. At 560, the measurements, values, etc., associated with each tag are obtained from the device(s) measuring the parameter associated with the tag. For example, values for first stage speed, second stage speed, third stage speed, first stage machining rate, second stage machining rate, third stage machining rate, etc., are obtained from devices (e.g., I/O devices monitoring the respective parameter) associated with the process. At 570, an initial tagset per update rate is compiled and forwarded to each of the requesting devices. The tagset includes the measured values and can include a tag masterset and/or, check code, etc. (as explained further herein). At 580, after a predetermined period of time equating to each update rate (for example, any of 100 ms, 200 ms, 500 ms, 1 second, 2 seconds, etc.), the current parameter values for that update rate tagset are obtained. At 590, a subsequent tagset for each update rate is generated and forwarded to the subscribing devices. The flow returns to 580 in conjunction with 590, wherein the process of obtaining parameter values, generation of a tagset at a particular time, and forwarding the tagset continues as required (e.g., for the duration of the process, a defined monitoring period, manufacture of a particular component, and the like).

Exemplary Operation of an Interface in Tagset Generation and Sharing

Figure 6:
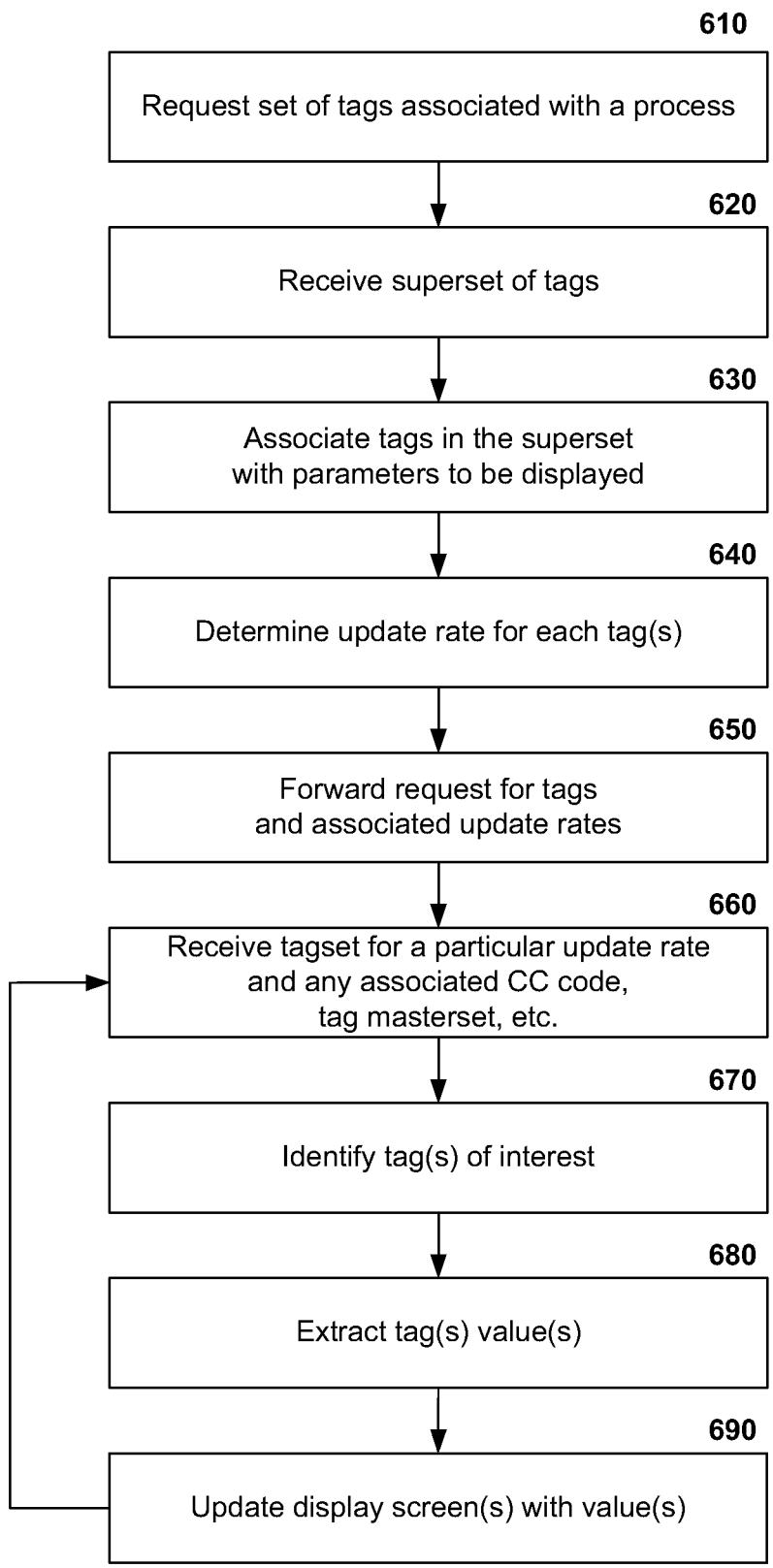
FIG. 6 is a flow diagram of an exemplary, non-limiting embodiment for requesting and receiving tagsets at an interface device.

FIG. 6 is a flow diagram of an exemplary, non-limiting embodiment for requesting and receiving tagsets at an interface device. At 610, a request is forwarded from an interface (e.g., any of interfaces 330A-330n) to a controller (e.g., controller 320) for a superset of tags (e.g., superset 325) associated with a process (e.g., process 110). The superset of tags relate to parameters, variables, etc., that are being monitored, or associated with, the process. At 620 the superset is received at the requesting interface. At 630, the received tags in the superset are reviewed and, as required, particular tags are associated with particular parameters of interest to the interface (e.g., to be displayed on any of the plurality of screens available on the interface).

At 640, an update rate is determined for each of the tags. At 650, the requested tags and associated update rates are forwarded from the interface to the controller. At 660, a tagset for each requested update rate is received at the interface from the controller. As previously described, a tagset includes the tags requested by the interface as well as any other tags requested for that update rate by the other interfaces associated with the controller. Further, the tagset can be accompanied by any of a check code, tag masterset, etc., as required to facilitate reception and understanding of the contents of the tagset. At 670, from all of the tags included in the tagset, the interface identifies which tags are of interest to the interface. Any tags not of interest (e.g., not selected by the interface) in the received tagset can be ignored by the interface operations. At 680, the value for each tag(s) of interest can be extracted from the tagset. At 690, the display is updated in accord with the extracted value(s). The flow returns to 660 whereupon a subsequent tagset is received and processed as required (e.g., duration of the process, defined monitoring period, manufacture of a particular component, and the like).

Generation of a Tagset for a Single Interface

Figure 7:
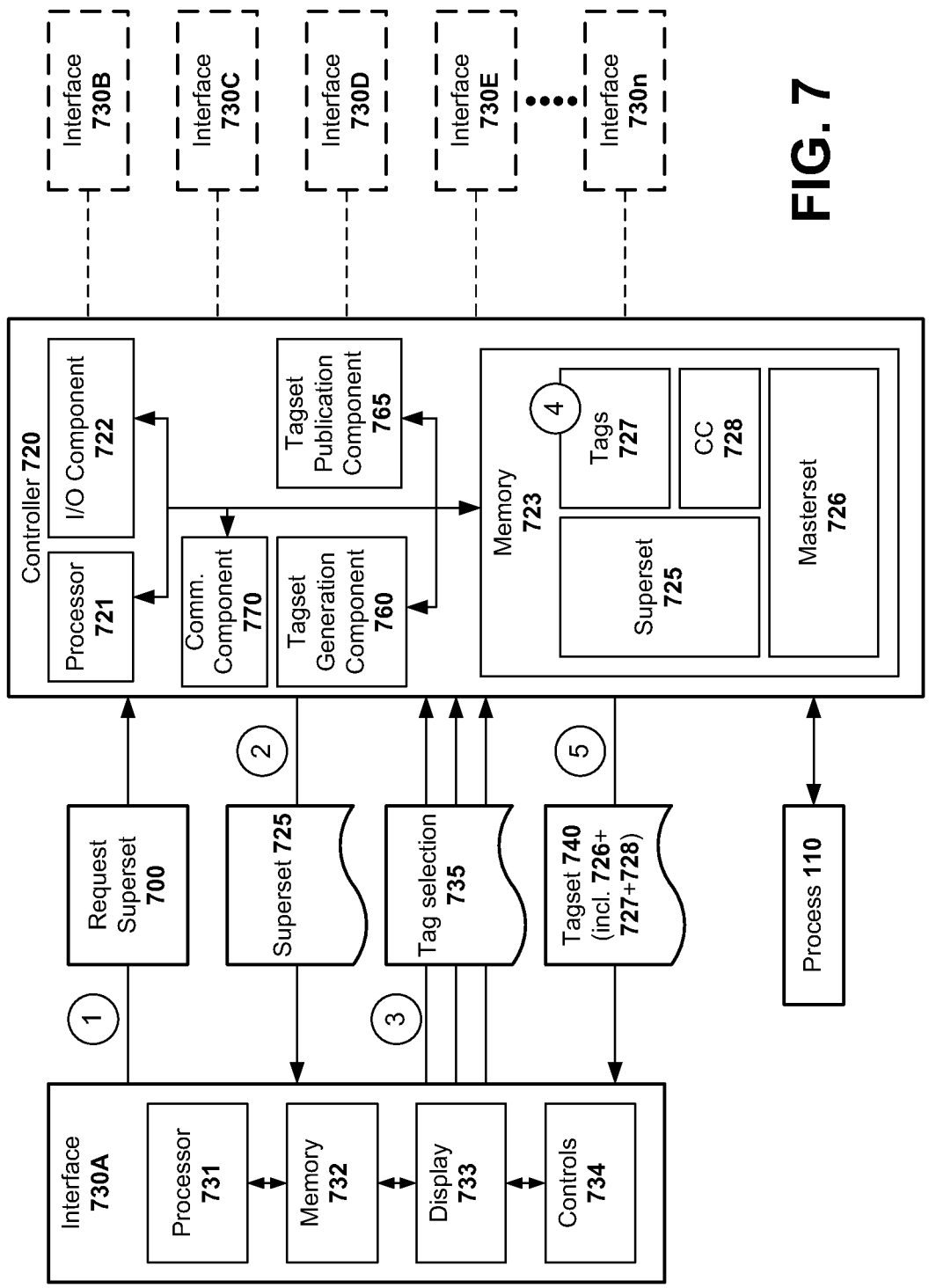
FIG. 7 is a block diagram of an exemplary, non-limiting embodiment for the association of a single interface with a controller for generation of a tagset.

FIG. 7 illustrates a block diagram of an exemplary, non-limiting embodiment for the association of a single interface with a controller for the generation of a tagset. Such a situation may occur when a controller is brought online and a first interface (e.g., in a plurality of interfaces) monitoring a process associated with the controller requires tags from the controller. As shown in FIG. 7, process 110 is being controlled in accordance with controller 720, wherein controller 720 is associated with any of interfaces 730A-730n. Controller 720 (and similarly, any of the controllers described herein) comprises an I/O component 722 which can communicate with devices and components associated with process 110. For example, I/O component 722 provides control instruction(s) to device(s), component(s), etc., controlling elements of process 110 and can also receive from the device(s), etc., measurements regarding such attributes as speed, position, time, temperature, pressure, etc. The received measurements can then be forwarded to the various interfaces for display to an operator interface, thereby facilitating the operator in gaining understanding of the process and make any adjustments, corrections, etc., as required for correct operation of process 110.

Controller 720 further comprises processor 721, which can be utilized to run various components, software, etc., as required by controller 720, to facilitate at least control of process 110, communicate tags, tagsets, check code, mastersets, etc., to devices associated with process 110 (e.g., interfaces 730A-730n) and communication and operation with regard to instructions and requests received from the various interfaces (e.g., interfaces 730A-730n).

Further, controller 720 includes memory 723, wherein memory 723 comprises a number of elements associated with the various embodiments presented herein. A superset 725 comprises a set of all the tags (e.g., parameters, variable, etc.) associated with process 110 to be monitored, or available to be monitored, by controller 720. Tags 727 is a compiled set of tags based upon the selected tags received from the respective interfaces associated with controller 720 and process 110. A masterset 726 is utilized to enable an interface to identify where in a sequence of tags comprising a tagset, tags of particular interest to the interface are located. For example, "where is a first pressure reading in the tagset?", "where is a third stage speed in the tagset?" The concept and utilization of a masterset is explained further below. Check code (CC) 728 is correction code (also known as cyclic redundancy check code) which can be utilized to identify if a received tagset has been updated, e.g., contains new tags, or tags were removed, in comparison with a previously received tagset. The concept of utilizing a check code is explained further below.

Further, controller 720 comprises tagset generation component 760 and tagset publication component 765. Tagset generation component 760 can be utilized, as described further below, to receive requests for a superset 725, and based upon the tags requested from the superset, generates tags 727, tagset 740, masterset 726, and check code 728, etc. Tagset publication component 765 can be utilized to forward tags 727, tagset 740, masterset 726, and check code 728, etc., to the requesting interfaces. Controller 720 also comprises a communication component 770 to facilitate communication between controller 720 and any associated interfaces, thereby enabling receipt of requests from the interfaces and forwarding of tagsets, etc., to the interfaces.

Interface 730A (and similarly any of interfaces 730B-730n, and further, any of the interfaces described herein) can include any of a processor 731, memory 732, display 733 and controls 734. Processor 731 can be utilized to run various components, software, etc., as required by interface 730A to facilitate at least one of control of process 110, communicate tag requests to controller 720, receive tagsets, mastersets, tags, check code, etc., from controller 720, display the tags (and parameter values), facilitate operator interaction to control process 110, etc. Memory 732 can be utilized to store information received from controller 720, such as a superset, a tag selection, tagset, tags, check code, masterset, etc. In an embodiment, check code 728 for a current tagset can be stored in memory 732 to facilitate comparison with a newly received tagset and associated check code to determine if the tags in the tagset have changed. In another embodiment, a masterset can be stored in memory 732 to be called upon as necessary to facilitate determination of tags comprising a tagset. Display 733 can be utilized to present the plurality of screens available to display the process information to an operator. Controls 734 can be either soft or hard controls enabling an operator to change parameter settings to facilitate further control of process 110.

While FIG. 7 depicts a plurality of interfaces to be associated with controller 720, FIG. 7 essentially relates to a first interface, e.g., interface 730A initially communicating with controller 720 and subsequently receiving tags. At 1, an initial communication 700 is generated at interface 730A requesting from controller 720 a set of all the parameters, variables, etc., available for monitoring with regard to process 110, and forwarded to controller 720 via communication component 770. At 2, the superset 725 of available tags is generated by tagset generation component 760 based upon parameters associated with process 110 and available at controller 720, e.g., via I/O component 722. Superset 725 is forwarded from controller 720 to interface 730A, e.g., via communication component 770. At 3, interface 730A selects from superset 725 the various tags of interest along with the required update rate for each particular tag, and communicates the selected tags and updates rates via communication component 770 to controller 720. For example, as shown in FIG. 7, interface 730A can, in one example, place three requests for tags, each request being for a different update rate. It is to be appreciated that the three requests are presented as an example, and any number of requests can be generated, e.g., a first request (e.g., 100 ms update rate), a second request (e.g., 500 ms update rate), third request (e.g., 1 second update rate), fourth request (e.g., 5 second update rate), etc. At 4, tagset generation component 760, based upon the requested tags and update rates received from interface 730A, compiles tags 727. Tags 727 comprises a listing of the tags grouped by update rate (as will be further described in FIG. 8). At 5, a tagset 740 (for a given update rate, e.g., any of tagsets 340A-n) is further generated by the tagset generation component 760 and forwarded from controller 720 to interface 730A, via tagset publication component 765. Tagset 740 includes masterset 726 detailing the sequence of the various tags 727 comprising tagset 740 along with check code 728 for the tags 727. Effectively, masterset 726 only has to be sent from controller 720 to interface 730A upon the first generation of tagset 740. For any subsequent tagsets 740 received, as long as no changes have been made to the set of tags in the tagset 740, then the masterset 726 should have the correct set of tags 727 and ordering for the tagset 740. However, if, subsequently, a new tag is added or removed from the set of tags 727, a new masterset 726 is generated to reflect the current set of tags 727 in the tagset 740. The concept of tags being added to and removed from a masterset is described below.

TABLE 1

Initial Table

| | | | Parameter | | | | |
|---|---|---|---|---|---|---|---|
| S1 | T1 | S2 | S3 | P2 | P1 | T3 | CC |
| Value 11 | 175 | 30 | 24 | 1012 | 1098 | 335 | 128 |

TABLE 2

Table with an Added Tag

| | | | | Parameter | | | | |
|---|---|---|---|---|---|---|---|---|
| S1 | T1 | T4 | S2 | S3 | P2 | P1 | T3 | CC |
| Value 13 | 180 | 276 | 34 | 26 | 1008 | 1079 | 330 | 163 |

TABLE 3

Table with Tag Removed

| | | | Parameter | | | |
|---|---|---|---|---|---|---|
| S1 | T1 | S2 | S3 | P1 | T3 | CC |
| Value 13 | 180 | 34 | 26 | 1079 | 330 | 113 |

Tables 1 to 3, illustrate the effect of adding and removing a tag. In Table 1, an initial tagset (e.g., tagset 740) is received at a first interface (e.g., interface 730A), wherein the tagset comprises seven parameters: speed 1, time 1, speed 2, speed 3, pressure 2, pressure 1, and time 3. Of the seven parameters, only five are of interest (as marked bold) to the first interface. Speed 3 and pressure 2 are included in the tagset as they have been requested by another interface and can be ignored by the first interface. A check code CC (e.g., check code 728) is included and has a value of 128 based upon the parameters in the first table.

In Table 2, the check code value has changed to 163, hence it is readily apparent that the parameters in the tagset are different from those in the initial set (Table 1). Temperature 4 has been added to the tagset (e.g., by tagset generation component 760) in response to selection by another interface. Owing to the change in the check code value, in an embodiment, a masterset associated with the tagset can be reviewed to determine the new sequence of values in the tagset. In an alternative embodiment, in response to detecting that the check code value has changed the interface can request the latest version of the masterset from the controller to determine which the sequence of content in the newly received tagset.

With Table 3 the check code is again different from that of Table 1. The masterset associated with the newly received tagset can be reviewed, from which it is determined that Pressure 2 has been removed. The examples shown in Tables 1-3, while discussed with regard to a plurality of interfaces is also applicable to a single interface where parameters are being added/removed in accordance with screens displayed on the interface (e.g., on display 733).

In a further embodiment, the check code can be a non-calculated value such as a time stamp (e.g., to µSec resolution) indicating when a change was made to a masterset.

Returning to FIG. 7, as described, check code 728 can be utilized to identify whether the tagset 740 (or set of tags 727) has been edited. For each generation (e.g., selection of tags 727) of tags 727 a check code 728 can be generated based upon the selected tags in tags 727. In an exemplary, non-limiting embodiment, upon an initial generation of tags 727 a one-way hash code (or the like) can be utilized to create a check code 728 value based upon the tags, e.g., based upon the ASCII characters comprising the names of the individual tags in tags 727. Upon each transmission of tagset 740, the check code 728 value can be transmitted (e.g., as part of a header field, or the like, of tagset 740), where, upon receipt at interface 730A, the check code 728 value can be compared with a previously received check code 728 value. If the check code 728 values match then the newly received tagset 740 comprises the same tags 727 as the previously received tagset. If the check code 728 values do not match, then the newly received tagset 740 comprises different tags 727 compared with the previously received tagset 740. In an exemplary, non-limiting embodiment, upon an error match of check codes 728 being determined, interface 730A can request a new masterset 726 from controller 720. In another exemplary, non-limiting embodiment, upon an error match of check codes 728 being determined, in the instance where a masterset 726 accompanies tagset 740, interface 730A can review the included masterset 726 and based thereon identify the sequence of tags 727 comprising tagset 740. The combination of utilizing check code 728 in combination with masterset 726 is suitable when a tag has been selected for addition/removal by an operator of interface 730A. Other embodiments for utilizing a check code in combination with a masterset are presented further herein with reference to FIG. 10 where a plurality of interfaces are interacting with a controller.

Figure 8:
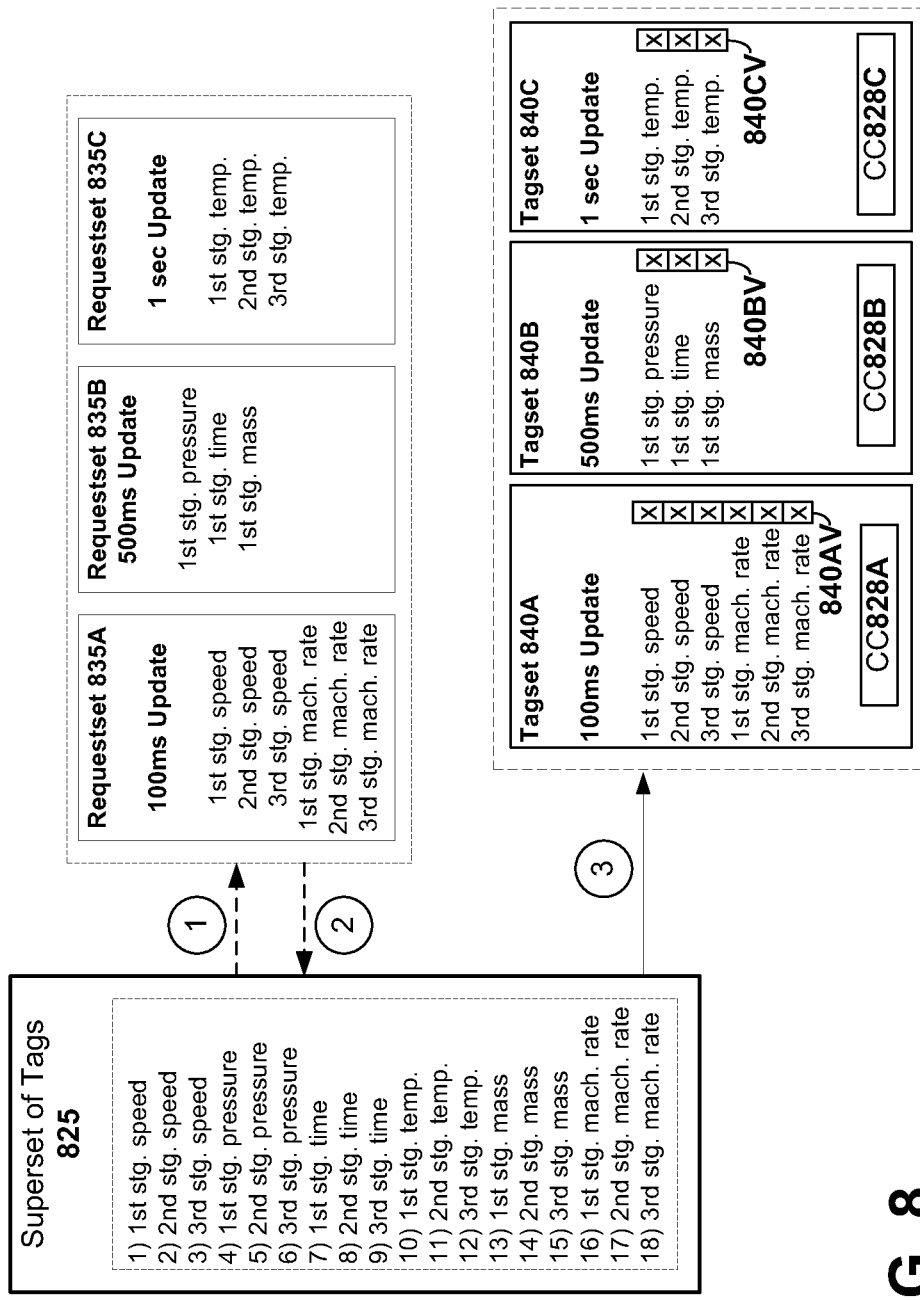
FIG. 8 illustrates an exemplary, non-limiting embodiment of a superset of tags being generated, from which a requested set is received, whereupon a tagset is compiled.

FIG. 8 illustrates an exemplary, non-limiting embodiment of a superset of tags being generated, from which a requested set is received from an interface, whereupon a tagset is compiled. At 1, a superset of tags 825 is forwarded from a controller (e.g., from controller 720 via communication component 770) to a requesting interface (e.g., requesting interface 730A). At 2, at the interface a subset(s) of the available tags (e.g., tags in superset 825) is selected and an update time associated with each tag. A requested tagset 835 (e.g., any of requestsets 835A, 835B, 835C, etc.) is generated comprising the selected tags grouped by update time. As shown superset 825 can comprise of a plurality of parameters, for example, a plurality of different speeds, process times, temperatures, mass, rate, etc. associated with a process (e.g., process 110). In the presented example, from the available eighteen parameters in the superset 825, twelve parameters have been selected at the interface, wherein each of the twelve parameters have been associated with a respective update time. For example first stage speed, second stage speed, third stage speed, first stage machining rate, second stage machining rate and third stage machining rate are all to be delivered with a frequency of 100 ms and comprise requestset 835A. Alternatively first stage pressure, first stage time, first stage mass are to be delivered with a frequency of 500 ms and comprise requestset 835B. Further, first stage temperature, second stage temperature and third stage temperature are to be delivered with a one second update time and comprise requestset 835C. Once the request set(s) has been compiled comprising the required parameters for respective delivery rates, the request tagsets (e.g., any of 835A-835C) can be forwarded from the interface to the controller. At 3, based upon the parameters and delivery times selected in the request tagsets 835A-C, the tagsets 840A-C can be generated. As shown in FIG. 7, only one interface is currently being associated with controller, and hence, as shown in FIG. 8, the parameters and update times selected in request tagsets 835A-C are the same as those provided in respective tagsets 840A-C. Along with the tags (e.g., values of the parameters as indicated by values 840AV-840CV) grouped by update times, tagsets 840A-C can be accompanied by a masterset of parameters which lists the sequence of the tags in the tagset 840A-C. For example, the masterset for tagset 840A comprises the six selected parameters 1st stage speed through to third stage machining rate, the masterset for tagset 840B comprises the three selected parameters 1st stage pressure through to third stage mass, the masterset for tagset 840C comprises the three selected parameters 1st stage temperature through to third stage temperature. (as explained further below). Each of the tagsets 840A-C also comprise respective checking code 828A-C, wherein checking codes 828A-C can be based on the parameters and update times selected in each of the tagsets 840A-C, as previously described. Steps 1, 2 and 3 of FIG. 8 can be performed as necessary. For example, at a subsequent time, a new screen is available for presentment on the interface and previously unselected parameters are to be displayed on the screen. The interface can request that the newly required parameter(s) be added to any of tagsets 840A-C, for a respective update rate. Accordingly, a new/updated tagset is generated along with an associated new check code (e.g., any of 828A-C). In another example, a parameter may no longer be required for display at the interface and a revised tagset (e.g., any of 840A-C) is generated with the reduced number of tags accompanied by a revised masterset and a newly calculated check code (e.g., any of 828A-C).

Figure 9:
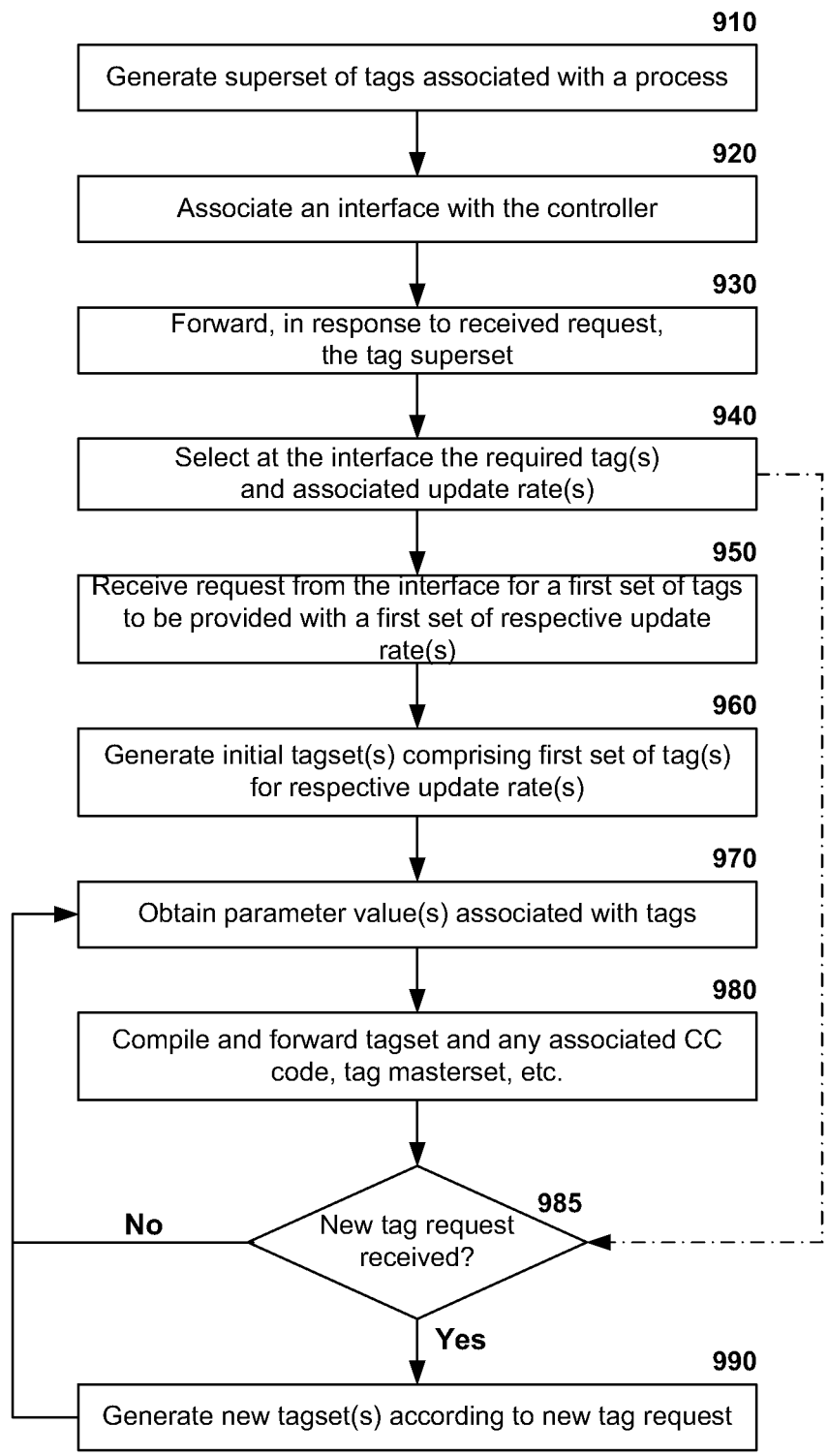
FIG. 9 is a flow diagram of an exemplary, non-limiting embodiment for generating a tagset for an interface associated with a controller.

FIG. 9 is a flow diagram of an exemplary, non-limiting embodiment for generating a tagset for an interface associated with a controller. At 910 from the various inputs/outputs between the controller (e.g., controller 720) and I/O devices associated with a process (e.g., process 110) a superset of tags being monitored/controlled by the controller is compiled (e.g., by tagset generation component 760). At 920 an interface (e.g., interface 730A) is associated with the controller. An example scenario for association is a controller has been brought online and one or more interfaces are being connected to the controller to facilitate presentation of process information captured by the controller to be presented to an operator, via the one or more interfaces. At 930, a request is received at the controller (e.g., via communication component 770) from the interface for the superset of tags, and based thereon, the superset is forwarded (e.g., via communication component 770) to the interface. At 940, from the superset of available tags, tags required for presentation/processing at the interface are selected at the interface (e.g., requestsets 835A-B for respective update rates). At 950, the requested set of tags (e.g., and of requestsets 835A-C) and respective update rate(s) (e.g., 100 ms, 200 ms, 500 ms, 1 second, 2 seconds, etc.) is received at the controller, from the interface. At 960, an initial tagset(s) (e.g., tagsets 840A-C) is compiled for the requested update rates for the respective tags (e.g., by tagset generation component 760). At 970, at each update time, the parameters values for that associated tagset (e.g., sensor readings) are obtained for the requested tags (e.g., via I/O component 722). At 980, at each update time, each compiled tagset is forwarded to the interface (e.g., via tagset publication component 765), accompanied by any associated information such as a masterset identifying the sequence of tags in the tagset (e.g., tags in any of tagsets 840A-C) and further, a checking code (e.g., check code 828A-C) generated based upon the tags in the tagset.

At 985, a determination is made at the controller regarding whether a new request for tags is received from the interface (as indicated by the broken line from 940). In response to no new tag being received, the flow returns to 970 whereupon the next instance of values are read for the respective tags and forwarded, along with any required check code and masterset, to the interface. In an aspect, the determination at 985 is performed for each respective tagset 840A-C. In response to a new tag request being received at 985, a new tagset (e.g., an update for any of tagset 840A-C, as well as generation of a new tagset where the update rate has not been previously selected) is generated at 990. Based upon the determination of an updated/new tagset is required the flow returns to 970 whereupon the next instance of values for the tags in the updated/new tagset is obtained. Flow proceeds to 980 whereupon the new/updated tagset is forwarded, accompanied, as required, by a new masterset and check code. The flow operations continue in accordance with monitoring of the process (e.g., duration of the process, defined monitoring period, manufacture of a particular component, and the like).

Generation of a Tagset for a Plurality of Interfaces

Figure 10:
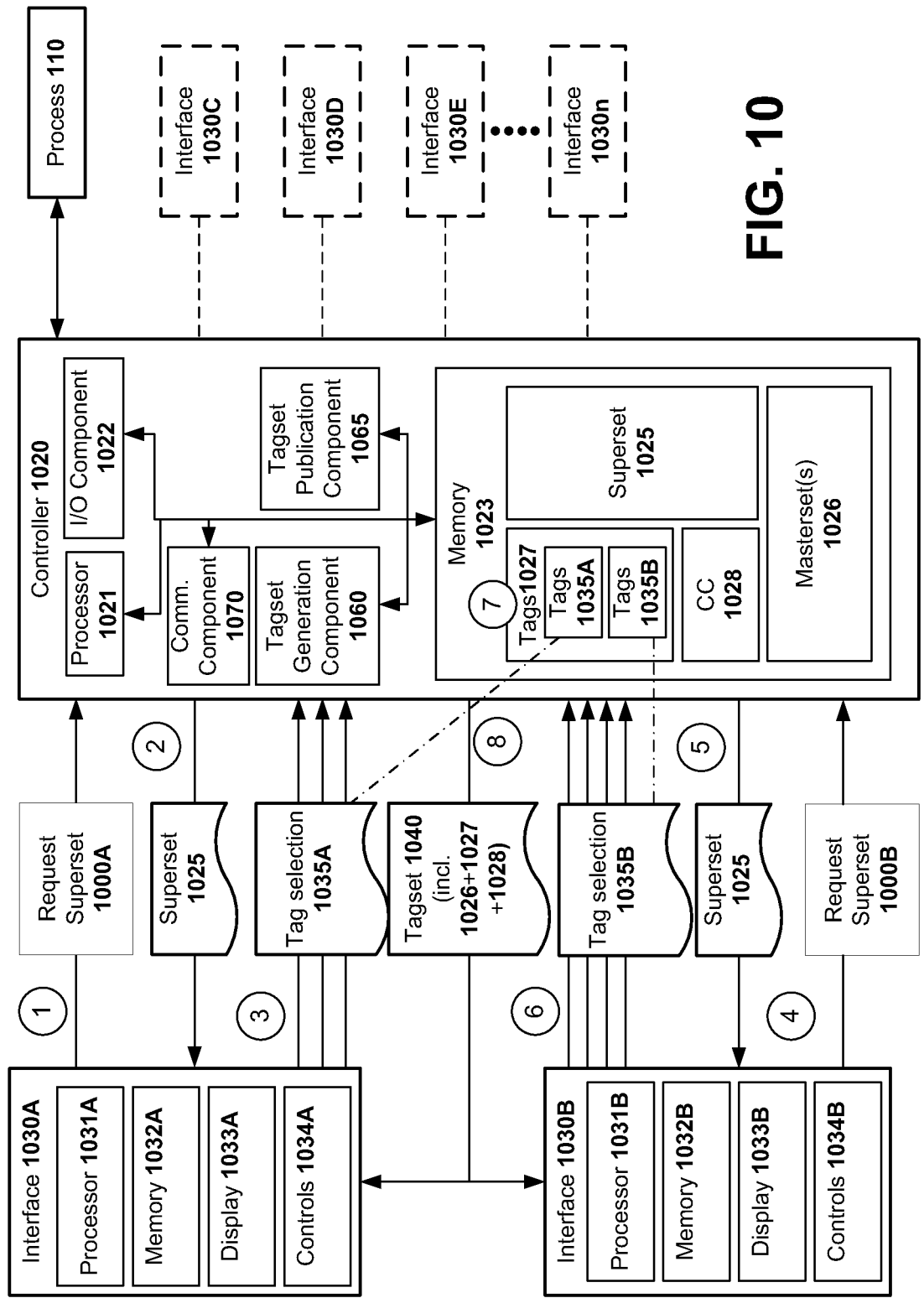
FIG. 10 is a block diagram of an exemplary, non-limiting embodiment for the association of a plurality of interfaces with a controller, and generation of a tagset compiling the various tag requests received from the plurality of interfaces.

FIG. 10 illustrates a block diagram of an exemplary, non-limiting embodiment for the association of a plurality of interfaces with the controller, and generation of one or more tagsets compiling the various tag requests received from the plurality of interfaces. Such a situation may occur as respective interfaces are added to a controller and the various tag requests are received and compiled to form a single tagset generated for each update rate. It is to be appreciated that while only a first interface and a second interface are shown, and a tagset(s) generated based thereon, the various embodiments presented herein (e.g., in FIGS. 10, 11, 12, etc.), are applicable to a situation of three or more interfaces in communication with a controller. As shown in FIG. 10, process 110 is being controlled/monitored in accordance with controller 1020, wherein controller 1020 is associated with any of interfaces 1030A-1030n. Controller 1020 comprises components which are similar in nature and operation to those previously described with reference to FIG. 7 and include an I/O component 1022 which can communicate with devices associated with process 110. Controller 1020 further comprises processor 1021, which can be utilized to run various components, software, etc., as required by controller 1020, to facilitate at least control of process 110, communicate tags to devices associated with process 110 (e.g., interfaces 1030A-1030n) and communication and operation with regard to instructions and requests received from the various interfaces.

Further, controller 1020 includes memory 1023 wherein memory 1023 comprises a number of elements associated with the various embodiments presented herein. A superset 1025 comprises a set of all the tags associated with process 110 to be monitored, or available to be monitored, by controller 1020. A masterset(s) 1026 is utilized to enable an interface to identify where in a sequence of tags comprising a tagset, tags of particular interest to the interface are located. Owing to a plurality of interfaces making requests for tags, it is anticipated that generation of masterset(s) 1026 will be a more frequent operation than that of masterset(s) 726 owing to interfaces being brought online (e.g., associated with controller 1020). However, once the plurality of interfaces have been brought online then the generation of masterset(s) 1026 will gradually become an infrequent operation as the system "settles down". Tags 1027 is the plurality of compiled sets of tags (e.g., requestsets 1035A, 1035B, etc.) based upon the requested tags received from the respective interfaces associated with controller 1020 and process 110. Check code (CC) 1028 is correction code (also known as cyclic redundancy check code) which can be utilized to identify if a received tagset has been updated, as previously described.

Tagset generation component 1060 can be utilized to receive requests for a superset 1025, and based upon the tags requested from the superset, generates tags 1027, tagset 1040, masterset 1026, and check code 1028. Tagset publication component 1065 can be utilized to forward any of tagset(s) 1027, tagset 1040, masterset 1026, and check code 1028 to the requesting interfaces. Controller 1020 also comprises a communication component 1070 to facilitate communication between controller 1020 and any associated interfaces, thereby enabling receipt of requests from the interfaces and forwarding of tagsets, etc., to the interfaces.

Further, the respective interfaces (e.g., any of interfaces 1030A-1030*n*) can comprise any of the components presented in interface 730A, e.g., at least one processor 1030A, 1030B (e.g., comparable to 731), at least one memory 1032A, 1032B (e.g., comparable to 732), at least one display 1033A, 1033B (e.g., comparable to 733), and at least one set of controls 1034A, 1034B (e.g., comparable to controls 734).

FIG. 10, at 1, depicts an initial communication 1000A being generated at interface 1030A requesting from controller 1020 the superset of all the parameters, variables, etc., available for monitoring with regard to process 110 (e.g., parameters, etc., associated with I/O component 1022). At 2, the superset 1025 of available tags, is forwarded via communication component 1070 from controller 1020 to interface 1030A. At 3, interface 1030A selects from superset 1025 the various tags of interest along with the required update rate for each particular tag and forwards the request set 1035A to the controller 1020. A similar series of operations occurs as interface 1030B is brought online, wherein at 4, in an initial communication 1000B interface 1030B requests from controller 1020 the superset of all tags available for monitoring with regard to process 110. At 5, the superset 1025 of available tags, is forwarded from controller 1020 to interface 1030B. At 6, interface 1030B selects from superset 1025 the required tags and the required update rate for each particular tag, and the request set 1035B is forwarded from the interface to the controller.

Figure 11:
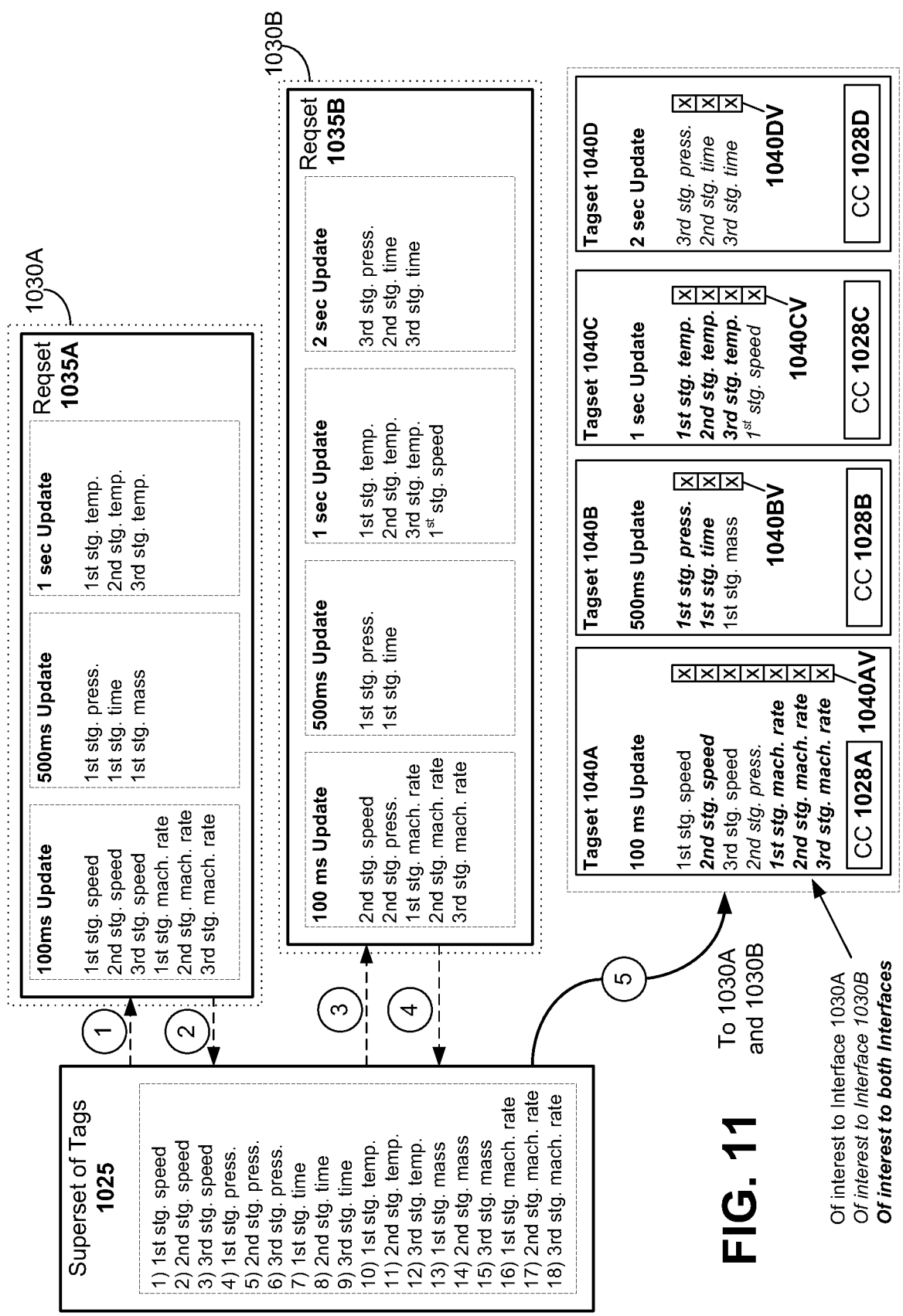
FIG. 11 is a block diagram of an exemplary, non-limiting embodiment for compiling a tagset based upon a plurality of request sets.

As shown in FIG. 10 (and further in FIG. 11) any number of tags can be requested for any number of update rates. Hence, for interface 1030A, at 3, the tag selection 1035A comprises three tagset requests. As shown in FIG. 11, interface 1030A places tagset requests for 100 ms, 500 ms and 1 second update rates. For interface 1030B, in FIG. 10, four tagset requests are placed for tag selection 1035B comprising 100 ms, 500 ms, 1 second and 2 second update rates (as shown in FIG. 11). It is to be appreciated that any number of respective tagsets can be requested for any given update rate, for a first tagset for a first update rate, through to an nth tagset for an nth update rate. Further, a parameter can be included in more than one tagset. For example, a parameter can be forwarded in a first tagset (e.g., with an update rate of 100 ms) to a first controller, and also forwarded in a second tagset (e.g., with an update rate of 500 ms) to a second controller.

FIG. 10, at 7, tagset generation component 1060, based upon the requested tags and update rates received from interfaces 1030A and 1030B, compiles tags 1027 (e.g., from request sets 1035A and 1035B). Tags 1027 comprises a listing of the tags grouped by update rate (as will be further described in FIG. 11). At 8, tagset 1040 is generated by tagset generation component 1060 and forwarded by tagset publication component 1065 to both interfaces 1030A and 1030B. Tagset 1040 can include masterset 1026 detailing the sequence of the various tags 1027 comprising tagset 1040 along with check code 1028 for the tags 1027.

In an embodiment, masterset 1026 can be sent from controller 720 to interfaces 1030A and 1030B whenever a change is made to a tagset 1040. In an alternative embodiment, masterset 1026 can be forwarded with every publication of tagset 1040 (e.g., whenever a tagset is generated such as 100 ms, 200 ms, 1 second, 2 seconds, etc.).

Turning to FIG. 11, illustrated is a block diagram of an exemplary, non-limiting embodiment for compiling a tagset based upon a plurality of requested sets. As shown in FIG. 11, at 1 a superset of tags 1025, based on a received request, is forwarded to interface 1030A. At 2, tag request set 1035A is generated comprising the tags required by interface 1030A for respective update rates and returned to controller 1020. Similarly, at 3 the superset of tags 1025, based on a received request, is forwarded to interface 1030B. At 4, tag request set 1035B is generated comprising the tags required by interface 1030B and returned to controller 1020. At 5, based upon the tag requests received from interfaces 1030A and 1030B, controller 1020 (e.g., tagset generation component 1060) compiles a plurality of tagsets 1040A-B, which can be accompanied by a masterset and respective code check (CC) 1028A-B. As shown in FIG. 11, tag request set 1035A comprises twelve tags selected from the eighteen tags available in superset 1025, while tag request set 1035B comprises fourteen tags selected from the eighteen tags available in superset 1025. The compiled tagsets 1040A-D comprise a combination of the tag requests, where a tag only of interest to interface 1030A is shown in normal font, a tag of interest to 1030B is shown italicized, while a tag of interest to both interfaces is shown bold italicized. Hence, with regard to the 100 ms update time, tagset 1040A, the first stage and third stage speeds are of interest only to interface 1030A, the second stage pressure is only of interest to interface 1030B, while second stage speed, first stage machining rate, second stage machining rate, and third stage machining rate are of interest to both interfaces. Further, while interface 1030A requires the first stage speed to be transmitted every 100 ms, interface 1030B only requires the first stage speed to be transmitted with a frequency of one second (reference tagset 1040B). With regard to the 500 ms update time, tagset 1040B, the first stage pressure and first stage time are of interest to both interfaces, while the first stage mass is only of interest to interface 1040B. For tagset 1040C, 1 second update rate, first stage temperature, second stage temperature, and third stage temperature are of interest to both interfaces, while first stage speed is only of interest to interface 1030B. With regard to the 2 second update rate, tagset 1040D, this update rate is only of interest to interface 1040D and accordingly when received by interface 1030A it can be ignored. Owing to first stage speed being present in the 100 ms update group (tagset 1040A) and also in the 1 sec update group (tagset 1040C), any update of the first stage speed occurring in tagset 1040A can be utilized by interface 1030A (e.g., to update the display) but ignored by interface 1030B, while alternatively, any update of the first stage speed occurring in tagset 1040C can be utilized by interface 1030B (e.g., to update the display) but ignored by interface 1030A.

Further, as shown in FIG. 11, each tagset (e.g., any of tagset 1040A-D) includes a respective check code (e.g., any of check code 1028A-D), as necessary a list of the parameters comprising the tagset (e.g., a masterlist or masterset of parameters), as well as the respective values recorded for each of the parameters comprising the tagset, as indicated by values (marked with value x) 1040AV-1040DV.

Figure 12:
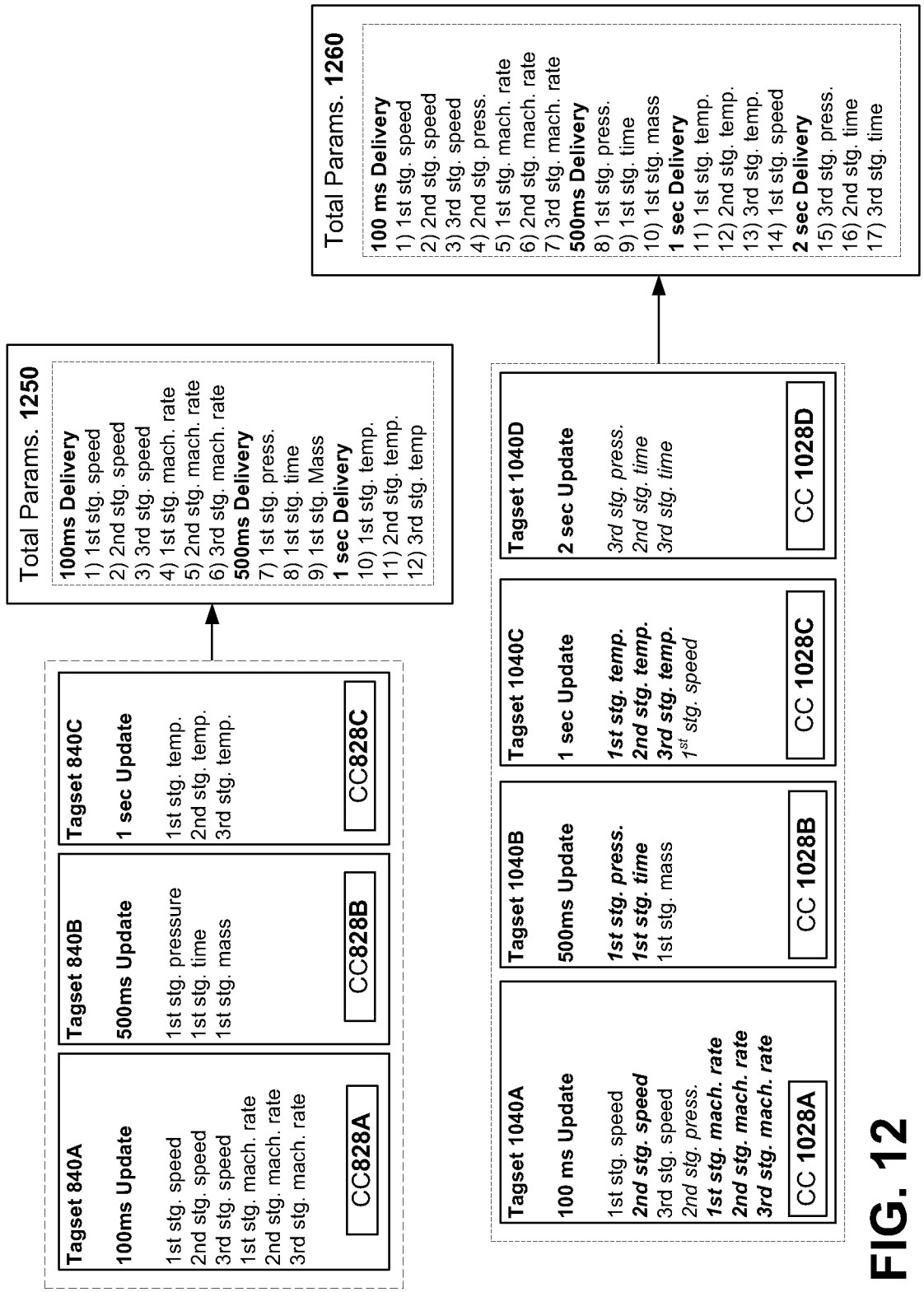
FIG. 12 illustrates comparison of tagsets and mastersets generated when a first interface associates with a controller and a second interface subsequently associates with the controller.

To further clarify various embodiments presented herein, FIG. 12 presents comparison of the tagsets and mastersets generated when a first interface associates with a controller and a second interface subsequently associates with the controller. With the single tag request generated by interface 730A (reference FIGS. 7 and 8), the total number of requested parameters (total parameters 1250) comprises the twelve tags selected by interface 730A, as shown in tagsets 840A-C. With the plurality of tag requests received from a plurality of interfaces (e.g., interfaces 1030A and 1030B), tagsets 1040A-D, and further total parameters 1260, comprise sixteen of the available eighteen tags (note first stage speed occurs twice at 100 ms update and 1 sec update). Further, tagset 1040D also includes parameters of interest to interface 1030B having a two second update rate, while no two second update rate tagset is requested by interface 1030A.

Figure 13:
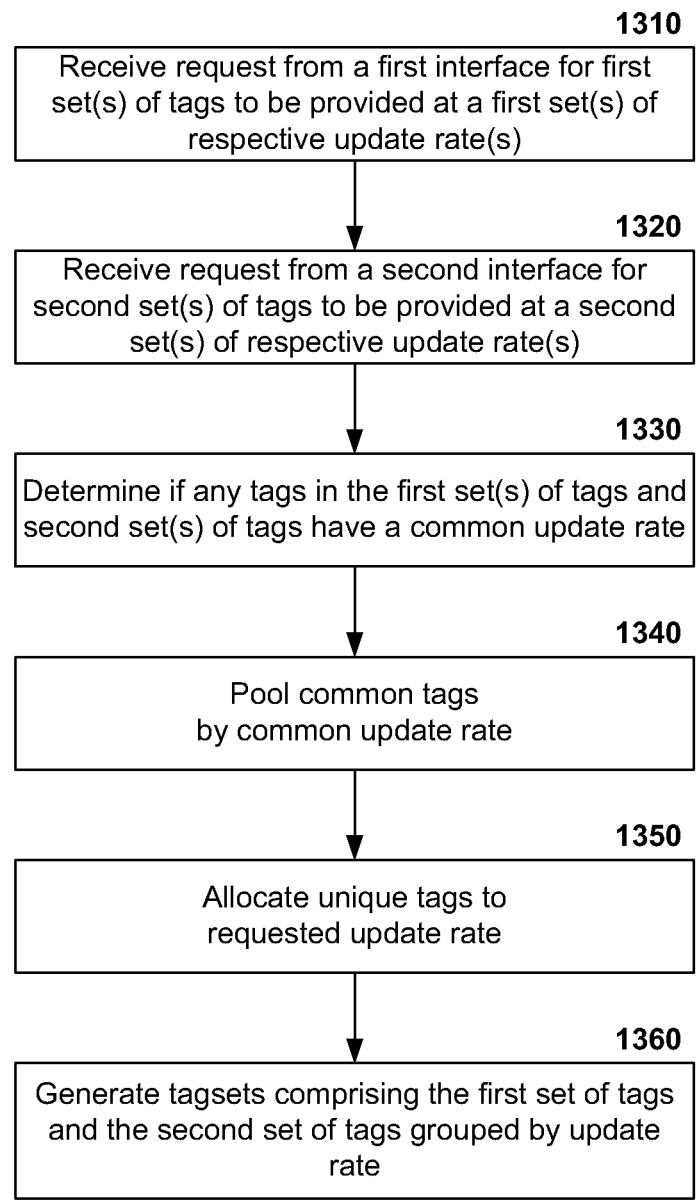
FIG. 13 is a flow diagram of an exemplary, non-limiting embodiment for generating a tagset when a first interface associates with a controller and a second interface subsequently associates with the controller.

FIG. 13, is a flow chart illustrating an exemplary, non-limiting embodiment for combining a plurality of tag requests into a single tagset. At 1310, a first tag request is received at a controller (e.g., at controller 1020) from a first interface (e.g., interface 1030A) for a first set of tags and respective update times. At 1320, a second tag request is received at the controller from a second interface (e.g., interface 1030B) for a second set of tags with respective update times. As previously described, with reference to FIGS. 10, 11 and 12, the tags in the respective request sets (e.g., request sets 1035A and 1035B) can comprise of tags being uniquely requested by an interface, tags being requested by two or more interfaces for the same update rate, or tags being requested by two or more interfaces but with different update rates. At 1330, a determination is made at the controller whether any of the tags received in the first request have the same update rate as the tags in the second request. At 1340, based upon the determination of tags having common update rates, the common tags are pooled based upon update rate (e.g., second stage speed is required by both interfaces for the 100 ms update rate and hence only one occurrence needs to be generated for this parameter in the 100 ms tagset 1040A). At 1350, for the tags which do not have a common update rate, a unique occurrence for each of the tags is generated for each respective update rate, as required. At 1360, the compiled tagset (e.g., any of tagsets 1040A-D) is generated at the required update time, comprising the required tags, whereupon the compiled tagset is forwarded to the requesting interfaces. As previously described, a tagset can comprise tags which have been requested by a particular interface along with tags not requested, those tags in the tagset which were not requested by the interface can be ignored.

Figure 14:
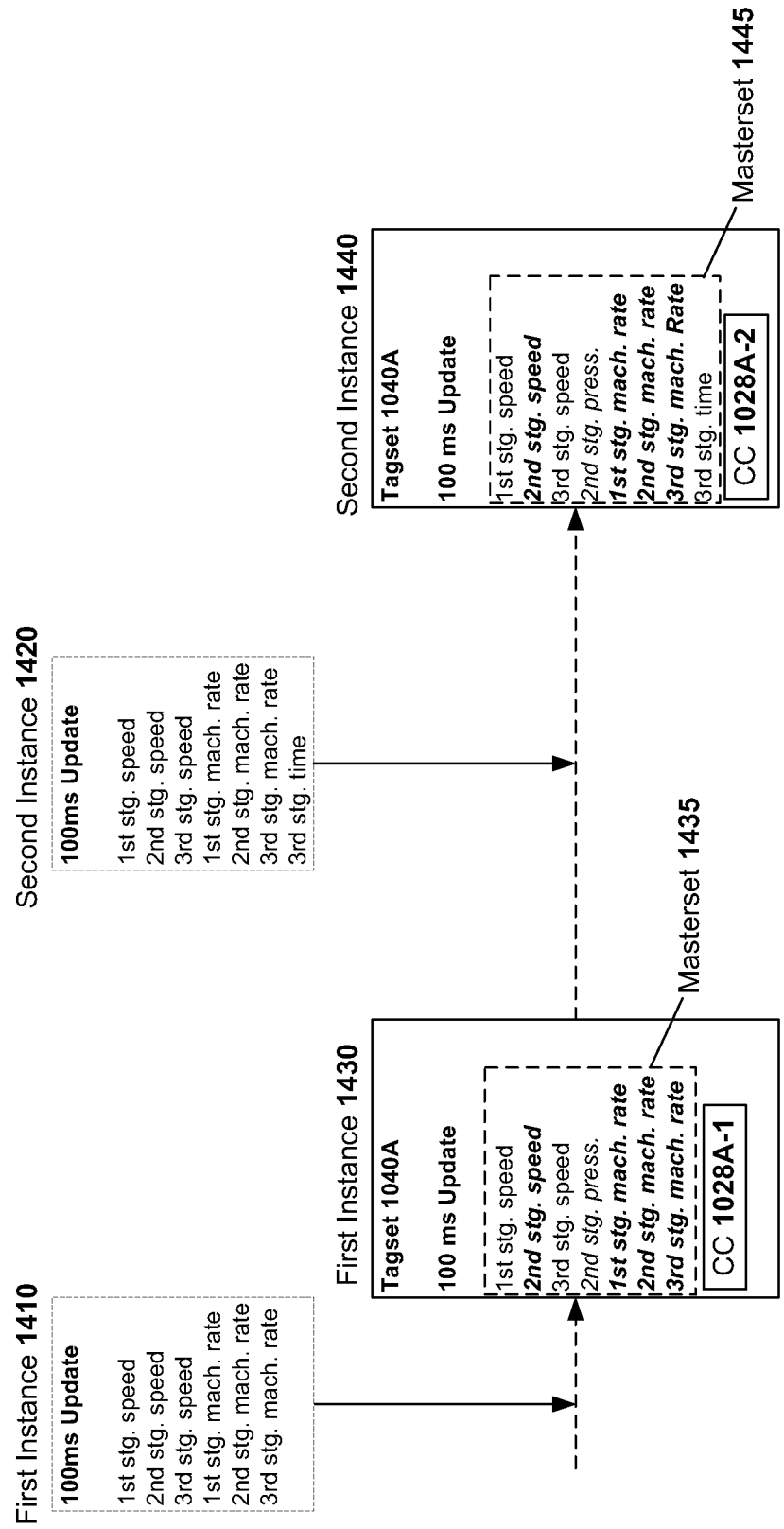
FIG. 14 is a flow diagram of an exemplary, non-limiting embodiment for determining whether the contents of a tagset have changed.

FIG. 14 illustrates a block diagram of an exemplary, non-limiting embodiment for updating of a masterset and check code in response to receiving a new tagset request. It is to be appreciated that while the tagset is being updated in response to a new parameter being requested, a similar situation can occur where a parameter is no longer required and is removed from a requested tagset. A first instance 1410 of a set of requested tags (e.g., requestset 1035A from interface 1030A) comprises of an initial selection of six parameters. Upon receipt of the requested tags, a first instance 1430 of tagset 1040A is generated and is accompanied by a first check code 1028A-1. The first tagset instance 1430 comprises the combination of tags as previously described with reference to FIG. 11, and the combination of requested tags results in a masterset of tags 1435 comprising seven parameters. Further, in an embodiment, as previously described, check code 1028A-1 can be generated based at least in part on the parameters comprising masterset 1435.

At a subsequent moment, a second instance 1420 of requested tags is received, where the third stage time parameter is now required by the interface (e.g., interface 1030A). In view of the newly requested parameter, a second instance 1440 of tagset 1040A is generated to include third stage time. As shown, masterset 1445 comprises eight parameters including the third stage time. Owing to the contents of tagset 1040A changing, a new check code 1028A-2 is generated based at least in part on the parameters comprising masterset 1445.

Figure 15:
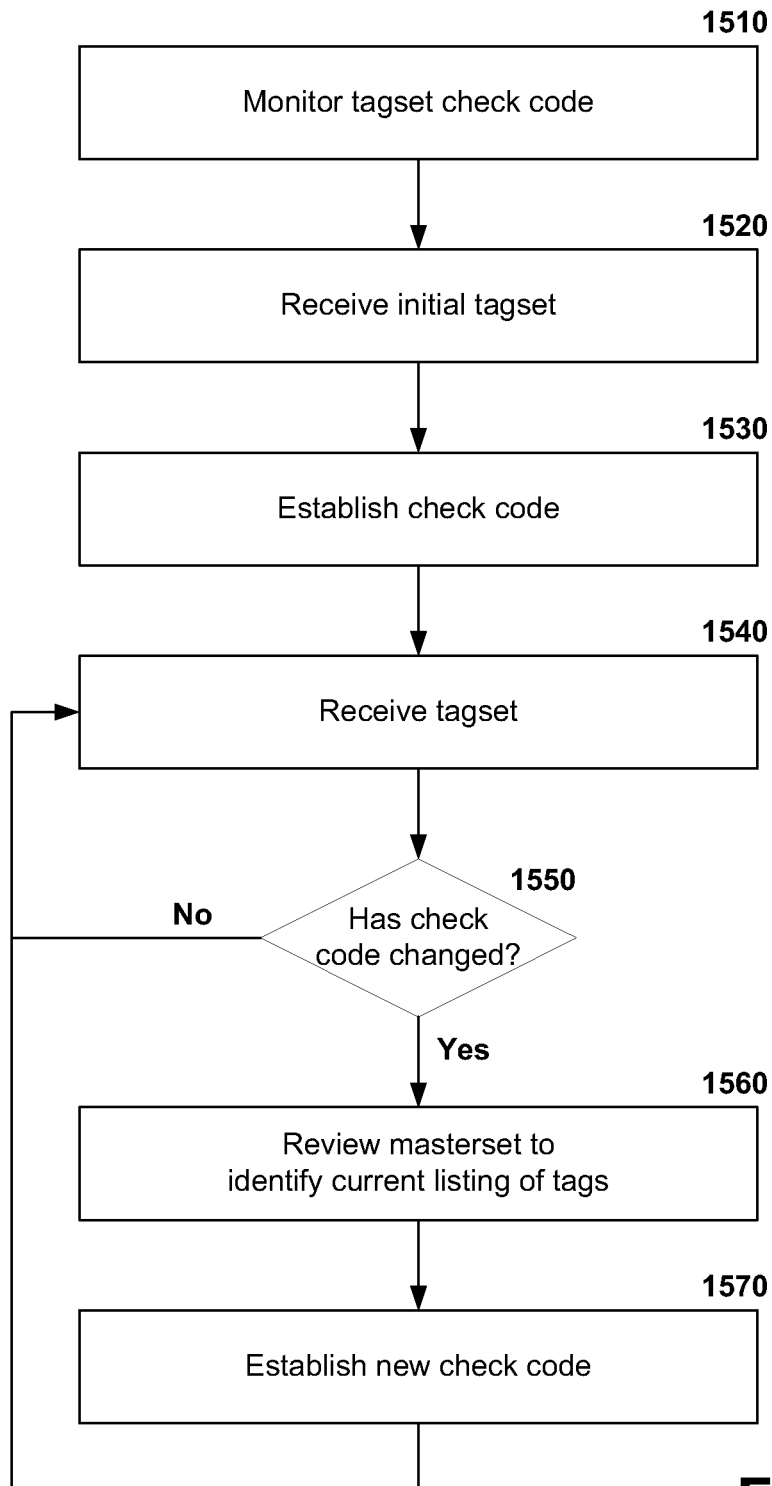
FIG. 15 is a block diagram of an exemplary, non-limiting embodiment for updating a tagset and masterlist.

FIG. 15, is a flow chart illustrating an exemplary, non-limiting embodiment for monitoring a check code in conjunction with a set of tags in a tagset. At 1510, an interface (e.g., any of interfaces 330A-330*n*, 730A-730*n*, and 1030A-1030*n*) is configured to monitor received tagsets to identify whether a check code value has changed. At 1520, an initial tagset (e.g., any of tagsets 340A-n, 740, 840A-C, and 1040A-D) is received, wherein, as previously described, the tagset can be accompanied by any information required to facilitate operation of any of the embodiments presented herein, where such information can include a check code (e.g., any of 728, 828A-C, or 1028A-D) and a masterset of tags comprising the tagset (e.g., masterset 1435 of tagset 1040A). At 1530, the check code (e.g., check code 1028A-1) in the initial tagset is reviewed and acts as the base value upon which a subsequent code check is based. At 1540, a new tagset is subsequently received (e.g., at the next update time). At 1550, the check code value in the new tagset is obtained and compared with the previously stored check code value, whereupon a determination is made regarding whether the new check code is different from the previously stored value. In response to a determination that "No" the check code value has not changed, it can be determined that the tags received in the tagset are the same as those previously received and the sequence of parameter values is consistent, whereupon the flow returns to 1540 as the next tagset is received.

In response to a determination that the check code value has changed (e.g., check code 1028A-2), the flow continues to 1560, whereupon the masterset (e.g., masterset 1445) for the newly received tagset is reviewed. It is to be appreciated that the masterset of parameters in the tagset can accompany the tagset thereby enabling the interface to simply review the masterset to obtain the new sequence of parameter values in the tagset. Alternatively, in an embodiment where the masterset does not accompany the tagset, a request can be placed with the controller to forward the masterset associated with the newly received tagset, thereby enabling the interface to subsequently determine the new sequence of parameter values in the tagset. At 1570, the check code of the newly received tagset is established as the reference value against which subsequently received tagsets are compared to facilitate determination of whether the sequence of parameters in the tagset have changed.

In effect, the various exemplary, non-limiting embodiments presented herein relate to a "push" system, the operation of which is in contrast to the "pull" system of conventional systems as presented in FIG. 2. A benefit of such a "push" system is in a situation of lost communications between an interface(s) and a controller, for example, resulting from loss of power after an electrical storm, interface taken offline for maintenance, controller taken offline, etc. With a conventional system the interface, upon re-establishing communication with the controller, has to follow a procedure of re-requesting a set of tags available from a controller, selecting the required tags, and forwarding the request to the controller, wherein it may involve considerable effort to identify which tags were being received prior to the loss of communications.

With the various embodiments presented herein, the tagset and associated information (e.g., supersets 325, 725, 1025, tags 727, 1027, check codes 720, 1028A-C, mastersets 1435, 1445, etc.) is maintained at the controller (e.g., in memory 723, 1023, etc.) and hence, after re-establishing communications the interface can request the latest tagset along with the tag masterset and check code. If the check code has not changed from the check code received prior to the loss of communications, then the interface can assume that the masterset comprises the same tags as that prior to the communication loss. If the check code has changed then the masterset can be reviewed to identify the sequence of tags. To support the "push" operation, portions of memories 723, 732, 1023, 1032A, 1032B, etc., can be non-volatile in nature to facilitate storage of tagsets, tags, masterset, check code, etc., in the event of power loss to the controller and/or interface(s) the various elements facilitating operation of the various embodiments presented herein are stored for subsequent retrieval, e.g., re-establish power to the controller and/or interface(s).

It is to be appreciated that the various embodiments presented herein regarding generation and sharing of tagsets by a controller component associated with (e.g., controlling, monitoring, etc.) a process are not confined specifically to operation on a controller component. The various presented embodiments can be utilized by any component associated with a process and involved with the generation of process information. It is to be further appreciated that the various embodiments presented herein regarding requesting and subsequent extraction of information from a shared tagset at one or more interface(s) associated with (e.g., controlling, monitoring, etc.) a process are not confined specifically to operation on an interface component. The various presented embodiments can be utilized by any component facilitating presentation and/or interaction of process information.

Further, it is to be appreciated that any of the controller(s) presented herein (e.g., any of controllers 220, 320, 720, or 1020) can be substantially any suitable industrial controller commonly employed in industrial automation, including, but not limited to, a programmable logic controller, a motion controller, a supervisory control and data acquisition system, a distributed control system, a process automation controller, and the like.

Exemplary Networked and Distributed Environments

One of ordinary skill in the art can appreciate that the various embodiments of a design apparatus for industrial automation environment applications and associated methods described herein can be implemented in connection with any computer or other client or server device, which can be deployed as part of a computer network or in a distributed computing environment, and can be connected to any kind of data store. In this regard, the various embodiments described herein can be implemented in any computer system or environment having any number of memory or storage units, and any number of applications and processes occurring across any number of storage units. This includes, but is not limited to, an environment with server computers and client computers deployed in a network environment or a distributed computing environment, having remote or local storage.

Distributed computing provides sharing of computer resources and services by communicative exchange among computing devices and systems. These resources and services include the exchange of information, cache storage and disk storage for objects, such as files. These resources and services also include the sharing of processing power across multiple processing units for load balancing, expansion of resources, specialization of processing, and the like. Distributed computing takes advantage of network connectivity, allowing clients to leverage their collective power to benefit the entire enterprise. In this regard, a variety of devices may have applications, objects or resources that may participate in the generation and sharing of tagsets as described for various embodiments of the subject disclosure.

Figure 16:
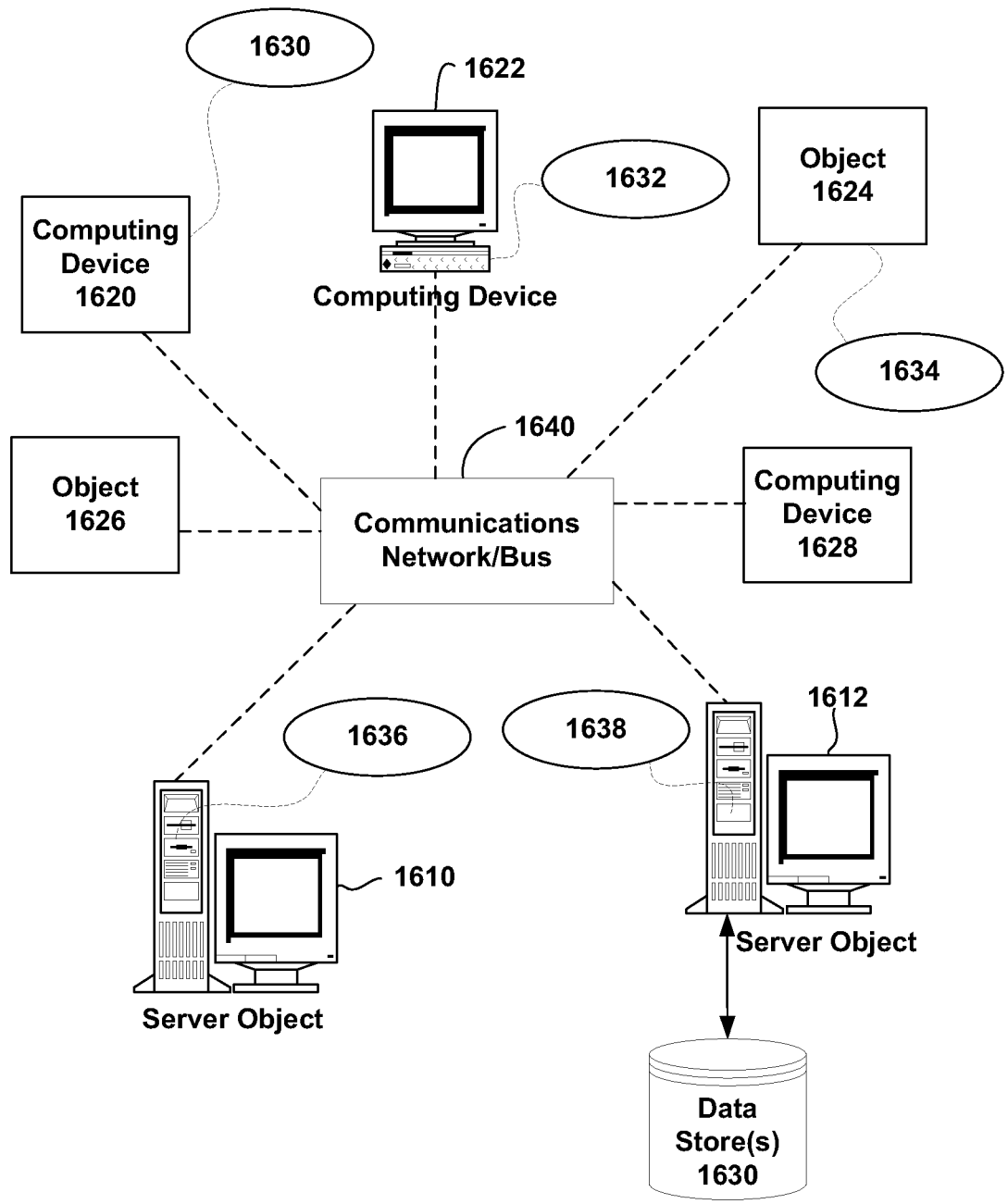
FIG. 16 illustrates an exemplary, non-limiting computing environment facilitating operation of one or more exemplary, non-limiting embodiments disclosed herein.

FIG. 16 provides a schematic diagram of an exemplary networked or distributed computing environment. The distributed computing environment comprises computing objects 1610, 1612, etc. and computing objects or devices 1620, 1622, 1624, 1626, 1628, etc., which may include programs, methods, data stores, programmable logic, etc., as represented by applications 1630, 1632, 1634, 1636, 1638. It can be appreciated that computing objects 1610, 1612, etc. and computing objects or devices 1620, 1622, 1624, 1626, 1628, etc. may comprise different devices, such as personal digital assistants (PDAs), audio/video devices, mobile phones, MP3 players, personal computers, laptops, etc.

Each computing object 1610, 1612, etc. and computing objects or devices 1620, 1622, 1624, 1626, 1628, etc. can communicate with one or more other computing objects 1610, 1612, etc. and computing objects or devices 1620, 1622, 1624, 1626, 1628, etc. by way of the communications network 1640, either directly or indirectly. Even though illustrated as a single element in FIG. 16, communications network 1640 may comprise other computing objects and computing devices that provide services to the system of FIG. 16, and/or may represent multiple interconnected networks, which are not shown. Each computing object 1610, 1612, etc. or computing object or device 1620, 1622, 1624, 1626, 1628, etc. can also contain an application, such as applications 1630, 1632, 1634, 1636, 1638, that might make use of an API, or other object, software, firmware and/or hardware, suitable for communication with or implementation of the design apparatus and associated mechanisms in accordance with various embodiments of the subject disclosure.

There are a variety of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the systems as described in various embodiments.

Thus, a host of network topologies and network infrastructures, such as client/server, peer-to-peer, or hybrid architectures, can be utilized. The "client" is a member of a class or group that uses the services of another class or group to which it is not related. A client can be a process, i.e., roughly a set of instructions or tasks, that requests a service provided by another program or process. The client process utilizes the requested service without having to "know" any working details about the other program or the service itself.

In a client/server architecture, particularly a networked system, a client is usually a computer that accesses shared network resources provided by another computer, e.g., a server. In the illustration of FIG. 16, as a non-limiting example, computing objects or devices 1620, 1622, 1624, 1626, 1628, etc. can be thought of as clients and computing objects 1610, 1612, etc. can be thought of as servers where computing objects 1610, 1612, etc., acting as servers provide data services, such as receiving data from client computing objects or devices 1620, 1622, 1624, 1626, 1628, etc., storing of data, processing of data, transmitting data to client computing objects or devices 1620, 1622, 1624, 1626, 1628, etc., although any computer can be considered a client, a server, or both, depending on the circumstances.

A server is typically a remote computer system accessible over a remote or local network, such as the Internet or wireless network infrastructures. The client process may be active in a first computer system, and the server process may be active in a second computer system, communicating with one another over a communications medium, thus providing distributed functionality and allowing multiple clients to take advantage of the information-gathering capabilities of the server.

In a network environment in which the communications network 1640 or bus is the Internet, for example, the computing objects 1610, 1612, etc. can be Web servers with which other computing objects or devices 1620, 1622, 1624, 1626, 1628, etc. communicate via any of a number of known protocols, such as the hypertext transfer protocol (HTTP). Computing objects 1610, 1612, etc. acting as servers may also serve as clients, e.g., computing objects or devices 1620, 1622, 1624, 1626, 1628, etc., as may be characteristic of a distributed computing environment.

Exemplary Computing Device

As mentioned, advantageously, the techniques described herein can be applied to any device where it is desirable to deploy an application, according to a plurality of configurations, to a plurality of devices in an industrial automation environment. It can be understood, therefore, that handheld, portable and other computing devices and computing objects of all kinds are contemplated for use in connection with the various embodiments, i.e., anywhere that where users can access, utilize, or deploy industrial applications. Accordingly, the below general purpose remote computer described below in FIG. 17 is but one example of a computing device.

Embodiments can partly be implemented via an operating system, for use by a developer of services for a device or object, and/or included within application software that operates to perform one or more functional aspects of the various embodiments described herein. Software may be described in the general context of computer-executable instructions, such as program modules, being executed by one or more computers, such as client workstations, servers or other devices. Those skilled in the art will appreciate that computer systems have a variety of configurations and protocols that can be used to communicate data, and thus, no particular configuration or protocol is considered limiting.

Figure 17:
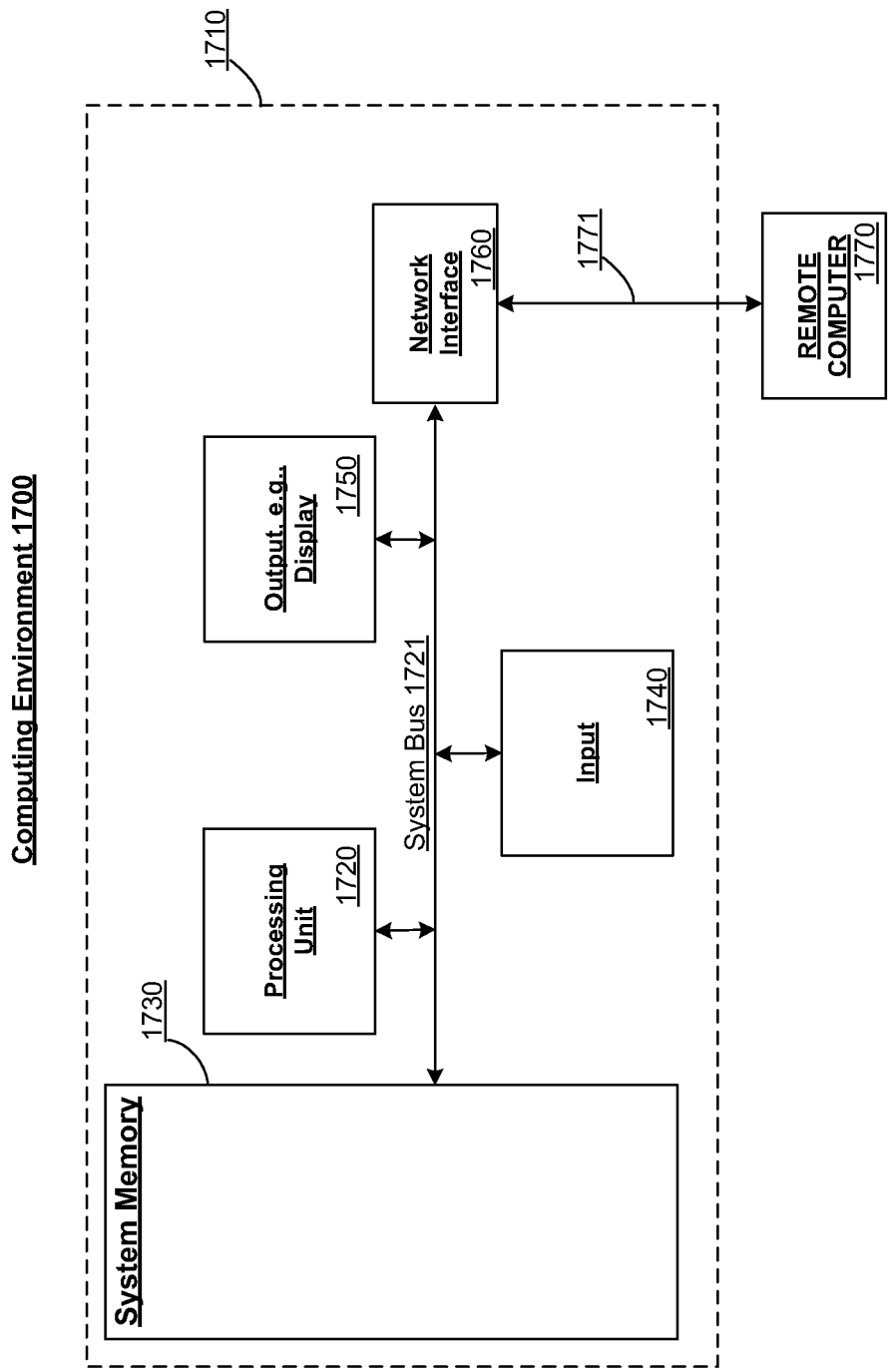
FIG. 17 illustrates an exemplary, non-limiting networking environment facilitating operation of one or more exemplary, embodiments disclosed herein.

FIG. 17 thus illustrates an example of a suitable computing system environment 1700 in which one or aspects of the embodiments described herein can be implemented, although as made clear above, the computing system environment 1700 is only one example of a suitable computing environment and is not intended to suggest any limitation as to scope of use or functionality. In addition, the computing system environment 1700 is not intended to be interpreted as having any dependency relating to any one or combination of components illustrated in the exemplary computing system environment 1700.

With reference to FIG. 17, an exemplary remote device for implementing one or more embodiments includes a general purpose computing device in the form of a computer 1710. Components of computer 1710 may include, but are not limited to, a processing unit 1720, a system memory 1730, and a system bus 1722 that couples various system components including the system memory to the processing unit 1720.

Computer 1710 typically includes a variety of computer readable media and can be any available media that can be accessed by computer 1710. The system memory 1730 may include computer storage media in the form of volatile and/or nonvolatile memory such as read only memory (ROM) and/or random access memory (RAM). By way of example, and not limitation, system memory 1730 may also include an operating system, application programs, other program modules, and program data. According to a further example, computer 2610 can also include a variety of other media (not shown), which can include, without limitation, RAM, ROM, EEPROM, flash memory or other memory technology, compact disk (CD) ROM, digital versatile disk (DVD) or other optical disk storage, magnetic cassettes, magnetic tape, magnetic disk storage or other magnetic storage devices, or other tangible and/or non-transitory media which can be used to store desired information.

A user can enter commands and information into the computer 1710 through input devices 1740. A monitor or other type of display device is also connected to the system bus 1722 via an interface, such as output interface 1750. In addition to a monitor, computers can also include other peripheral output devices such as speakers and a printer, which may be connected through output interface 1750.

The computer 1710 may operate in a networked or distributed environment using logical connections to one or more other remote computers, such as remote computer 1770. The remote computer 1770 may be a personal computer, a server, a router, a network PC, a peer device or other common network node, or any other remote media consumption or transmission device, and may include any or all of the elements described above relative to the computer 1710. The logical connections depicted in FIG. 17 include a network 1772, such local area network (LAN) or a wide area network (WAN), but may also include other networks/buses. Such networking environments are commonplace in homes, offices, enterprise-wide computer networks, intranets and the Internet.

As mentioned above, while exemplary embodiments have been described in connection with various computing devices and network architectures, the underlying concepts may be applied to any network system and any computing device or system in which it is desirable to implement a game for real-world application.

Also, there are multiple ways to implement the same or similar functionality, e.g., an appropriate API, tool kit, driver code, operating system, control, standalone or downloadable software object, etc. which enables applications and services to take advantage of the techniques provided herein. Thus, embodiments herein are contemplated from the standpoint of an API (or other software object), as well as from a software or hardware object that implements one or more embodiments as described herein. Thus, various embodiments described herein can have aspects that are wholly in hardware, partly in hardware and partly in software, as well as in software.

The word "exemplary" is used herein to mean serving as an example, instance, or illustration. For the avoidance of doubt, the subject matter disclosed herein is not limited by such examples. In addition, any aspect or design described herein as "exemplary" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used, for the avoidance of doubt, such terms are intended to be inclusive in a manner similar to the term "comprising" as an open transition word without precluding any additional or other elements when employed in a claim.

As mentioned, the various techniques described herein may be implemented in connection with hardware or software or, where appropriate, with a combination of both. As used herein, the terms "component", "module", "system", and the like, are likewise intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on computer and the computer can be a component. One or more components may reside within a process and/or thread of execution and a component may be localized on one computer and/or distributed between two or more computers.

The aforementioned systems have been described with respect to interaction between several components. It can be appreciated that such systems and components can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it can be noted that one or more components may be combined into a single component providing aggregate functionality or divided into several separate sub-components, and that any one or more middle layers, such as a management layer, may be provided to communicatively couple to such sub-components in order to provide integrated functionality. Any components described herein may also interact with one or more other components not specifically described herein but generally known by those of skill in the art.

In view of the exemplary systems described supra, methodologies that may be implemented in accordance with the described subject matter can also be appreciated with reference to the flowcharts of the various figures. While for purposes of simplicity of explanation, the methodologies are shown and described as a series of blocks, it is to be understood and appreciated that the various embodiments are not limited by the order of the blocks, as some blocks may occur in different orders and/or concurrently with other blocks from what is depicted and described herein. Where non-sequential, or branched, flow is illustrated via flowchart, it can be appreciated that various other branches, flow paths, and orders of the blocks, may be implemented which achieve the same or a similar result. Moreover, some illustrated blocks are optional in implementing the methodologies described hereinafter.

In addition to the various embodiments described herein, it is to be understood that other similar embodiments can be used or modifications and additions can be made to the described embodiment(s) for performing the same or equivalent function of the corresponding embodiment(s) without deviating therefrom. Still further, multiple processing chips or multiple devices can share the performance of one or more functions described herein, and similarly, storage can be effected across a plurality of devices. Accordingly, the invention is not to be limited to any single embodiment, but rather is to be construed in breadth, spirit and scope in accordance with the appended claims.

What is claimed is:

1. A method, comprising:
   receiving, by a system comprising a processor, from each of a plurality of controllers each associated with a respective terminal in an industrial process, a request including a set of parameters related to process control information and an update rate for each of the parameters in the set;
   compiling, by the system for each of the update rates amongst the requests, a list including all parameters that share a particular update rate; and
   forwarding, by the system for each list compiled, the list at the particular update rate to the plurality of controllers to initiate display of respective subsets of the parameters in the list on the associated terminals at the particular update rate.

2. The method of claim 1, wherein the parameters of the set identify at least one of a measurement, data, value, parameter, or variable.

3. The method of claim 1, further comprising generating a masterset including a sequence of available parameters related to the process control information.

4. The method of claim 3, further comprising updating the sequence of available parameters in the masterset in response to a parameter being removed from the sequence.

5. The method of claim 4, further comprising generating a check code associated with the compiled content of the list.

6. The method of claim 5, further comprising sending, to at least one controller, the updated masterset in response to the at least one controller determining a change to the check code.

7. The method of claim 1, further comprising sending, to at least one controller, a superset of tags, wherein the set of parameters included in request is selected from the superset.

8. A non-transitory computer-readable storage medium having stored thereon computer-executable instructions that, in response to execution, cause a system comprising a processor to perform operations, comprising:
   receiving, from each of a plurality of controllers each associated with a respective terminal in an industrial process, a request including a set of parameters related to process control information and an update rate for each of the parameters in the set;

compiling, for each of the update rates amongst the requests, a list including all parameters that share a particular update rate; and forwarding, for each list compiled, the list at the particular update rate to the plurality of controllers to initiate display of respective subsets of the parameters in the list on the associated terminals at the particular update rate.

9. The computer-readable storage medium of claim 8, wherein the parameters of the set identify at least one of a measurement, data, value, parameter, or variable.

10. The computer-readable storage medium of claim 8, the operations further comprising generating a masterset including a sequence of available parameters related to the process control information.

11. The computer-readable storage medium of claim 10, the operations further comprising updating the sequence of available parameters in the masterset in response to a parameter being removed from the sequence.

12. The computer-readable storage medium of claim 11, the operations further comprising generating a check code associated with the compiled content of the list.

13. The computer-readable storage medium of claim 12, the operations further comprising sending, to at least one controller, the updated masterset in response to the at least one controller determining a change to the check code.

14. The computer-readable storage medium of claim 8, the operations further comprising sending, to at least one controller, a superset of tags, wherein the set of parameters included in request is selected from the superset.

15. A system comprising:
a memory that stores computer-executable components;
a controller, operatively coupled to the memory, which executes computer-executable components, comprising:
  a tagset generation component configured to:
    receive, from each of a plurality of interfaces each associated with a respective terminal in an industrial process, a request including a set of parameters related to process control information and an update rate for each of the parameters in the set; and
    compile, for each of the update rates amongst the requests, a list including all parameters that share a particular update rate; and
  a list publication component configured to:
    forward, for each list compiled, the list at the particular update rate to the plurality of controllers to initiate display of respective subsets of the parameters in the list on the associated terminals at the particular update rate.

16. The system of claim 15, wherein the parameters of the set identify at least one of a measurement, data, value, parameter, or variable.

17. The system of claim 15, the tagset generation component further configured to generate a masterset including a sequence of available parameters related to the process control information.

18. The system of claim 17, the tagset generation component further configured to update the sequence of available parameters in the masterset in response to a parameter being removed from the sequence.

19. The system of claim 18, the tagset generation component further configured to generate a check code associated with the compiled content of the list.

20. The system of claim 19, the tagset generation component further configured to send, to at least one controller, the updated masterset in response to the at least one controller determining a change to the check code.

* * * * *